United States Patent
Mi et al.

(10) Patent No.: US 8,345,438 B2
(45) Date of Patent: Jan. 1, 2013

(54) ELECTRONIC PART MODULE AND METHOD OF MAKING THE SAME

(75) Inventors: Xiaoyu Mi, Kawasaki (JP); Tsuyoshi Matsuomoto, Kawasaki (JP); Satoshi Ueda, Kawasaki (JP); Takeo Takahashi, Nagano (JP)

(73) Assignees: Fujitsu Limited, Kawasaki (JP); Taiyo Yuden Co., Ltd., Tokyo (JP)

( * ) Notice: Subject to any disclaimer, the term of this patent is extended or adjusted under 35 U.S.C. 154(b) by 807 days.

(21) Appl. No.: 11/896,036

(22) Filed: Aug. 29, 2007

(65) Prior Publication Data

US 2008/0055873 A1   Mar. 6, 2008

(30) Foreign Application Priority Data

Aug. 31, 2006 (JP) ................................. 2006-235727

(51) Int. Cl.
*H05K 7/00* (2006.01)
(52) U.S. Cl. ......... 361/782; 361/811; 361/777; 174/260
(58) Field of Classification Search .................. 361/782, 361/811, 777; 257/748
See application file for complete search history.

(56) References Cited

U.S. PATENT DOCUMENTS

| | | | | |
|---|---|---|---|---|
| 4,253,079 | A * | 2/1981 | Brosh ........................... | 336/84 C |
| 5,095,357 | A * | 3/1992 | Andoh et al. .................. | 257/379 |
| 6,236,297 | B1 * | 5/2001 | Chou et al. ..................... | 336/200 |
| 6,377,464 | B1 | 4/2002 | Hashemi et al. ............... | 361/760 |
| 6,608,361 | B2 | 8/2003 | Chang et al. ................... | 257/499 |
| 6,611,035 | B2 * | 8/2003 | Inoue ............................. | 257/421 |
| 6,800,936 | B2 | 10/2004 | Kosemura et al. ............. | 257/748 |
| 6,885,561 | B1 | 4/2005 | Hashemi et al. ............... | 361/760 |
| 7,199,457 | B2 | 4/2007 | Ogawa ........................... | 257/684 |
| 2004/0246692 | A1 * | 12/2004 | Satoh et al. .................... | 361/782 |
| 2006/0038635 | A1 * | 2/2006 | Richiuso et al. ............... | 333/177 |
| 2006/0170071 | A1 * | 8/2006 | Imaoka et al. ................. | 257/531 |

FOREIGN PATENT DOCUMENTS

| | | |
|---|---|---|
| CN | 1339175 | 3/2002 |
| JP | 08-274575 | 10/1996 |
| JP | 10-294421 | 11/1998 |
| JP | 2000-36657 | 2/2000 |
| JP | 2002-334806 | 11/2002 |
| JP | 2003-32076 | 1/2003 |
| KR | 10-2004-0034575 | 4/2004 |

OTHER PUBLICATIONS

Korean Office Action dated Feb. 5, 2009 in Korean.
Chinese Office Action dated Oct. 10, 2008.
Office Action dated Feb. 1, 2011 corresponding to Chinese Patent application No. 200710147162.8.

* cited by examiner

*Primary Examiner* — Tuan T Dinh
*Assistant Examiner* — Steven Sawyer
(74) *Attorney, Agent, or Firm* — Kratz, Quintos & Hanson, LLP

(57) ABSTRACT

An electronic part module includes a wiring substrate, a passive device group of passive devices formed on the wiring substrate, and device chips mounted on the wiring substrate. Such an electronic part module is made in the following manner. First, a wiring substrate wafer is made, to include a plurality of electronic part module formation areas. Then, a plurality of passive devices are formed in each of the electronic part module formation areas on the wiring substrate wafer. Then, the device chips are formed on each of the electronic part module formation areas on the wiring substrate wafer. Finally, the wiring substrate wafer is divided.

16 Claims, 19 Drawing Sheets

(a)

(b)

(c)

ELECTRONIC PART MODULE AND METHOD OF MAKING THE SAME

BACKGROUND OF THE INVENTION

1. Field of the Invention

The present invention relates to an electronic part module, in particular an electronic module which contain a plurality of device chips and a plurality of passive parts as their constituent elements. The present invention also relates to a manufacturing method of the electronic part modules.

2. Description of the Related Art

Our information society is dependent upon a variety of information processing equipment including mainframe computers, personal computers and mobile communication terminals. In all of these fields, efforts are being made for higher processing speed, smaller size of equipment, increased versatility, reduced power consumption, and so on. All of these improvements are mainly dependent upon improved level of circuit integrity and performance (higher speed, advanced functionality, etc.) of numerous semiconductor devices incorporated in the equipment and apparatuses. Multi-chip module (MCM) technology is known to be one of the means for achieving such goals as improved level of circuit integrity and performance of semiconductor devices. MCM technology is disclosed in e.g. the following Patent Documents 1 and 2:

Patent Document 1: JP-A-H10-294421
Patent Document 2: JP-A-2000-36657

MCMs generally include a wiring substrate as a base substrate of the entire module, a plurality of device chips mounted on the wiring substrate in the form of bear chips, and a plurality of passive parts (capacitors, inductors, resistors, etc.) There are different types of MCMs; MCM-L (MCM-Laminated), MCM-C (MCM-Ceramic), and MCM-D (MCM-Deposited). Categorization into these three types is based upon the build of their wiring substrate serving as a base substrate.

MCM-L uses a wiring substrate manufactured from a resin substrate made of laminated resin material, as the base substrate for the entire module. The wiring substrate includes wiring on and/or inside the resin substrate, to which device chips are mounted as bear chips. Passive parts mounted on the wiring substrate are generally individual products manufactured as devices for surface mounting. Sometimes, the passive parts are placed inside the wiring substrate.

If an MCM-L is configured by using individual passive parts which are produced separately for surface mounting on a wiring substrate, it is sometimes impossible to accomplish sufficient size reduction of the module since surface mount type passive parts are relatively large individual chips each having their own substrate where their structures are built.

If an MCM-L is configured by using passive parts which are placed inside the wiring substrate, it is sometimes impossible for the module to perform sufficiently. In the wiring substrate, spaces between the passive devices, wires, and space between a pair of electrodes in each capacitor are all filled with a resin material (dielectric material) that constitutes the wiring substrate. Although this is preferable for capacitors inside the wiring substrate because a high dielectric constant of the resin material allows to obtain a large electrostatic capacity, it is not preferable for other passive devices (particularly for inductors) and the wires inside the wiring substrate because a low dielectric constant is desirable in order to reduce parasite capacities between the passive devices and wires. As described, two mutually conflicting requirements must be met by the resin material which constitutes the wiring substrate in order to achieve the goal of improved performance. In addition, for inductors embedded in the wiring substrate, there is a problem of decreased Q factor caused by parasite capacities. For these reasons, an MCM-L having its passive parts incorporated within the wiring substrate is sometimes not capable of performing sufficiently.

MCM-C uses a wiring substrate manufactured from a ceramic substrate as the base substrate for the entire module. Types of the wiring substrate for MCM-C include a single-layer ceramic substrate having a surface provided with a thick film wiring by printing, and a multilayer substrate constituted by a plurality of co-sintered ceramic substrates each having a surface printed with a wiring pattern. On such a wiring substrate, device chips are mounted as bear chips. Passive parts mounted on the wiring substrate are generally individual products manufactured separately as surface mount devices. Sometimes, the passive parts are built inside the wiring substrate.

If an MCM-C is configured by using individual passive parts which are produced separately for surface mounting on a wiring substrate, it is sometimes impossible to accomplish sufficient size reduction of the module since the surface mount type passive parts are, as described above, relatively large individual chips each having their own substrate where their structures are built.

If an MCM-C is configured by using passive parts which are built inside the wiring substrate, it is sometimes impossible for the module to perform sufficiently. In the wiring substrate, spaces between the passive devices, wires, and space between a pair of electrodes in each capacitor are all filled with a ceramic material (dielectric material) that constitutes the wiring substrate. Although this is preferable for capacitors inside the wiring substrate because a high dielectric constant of the ceramic material allows to obtain a large electrostatic capacity, it is not preferable for other passive devices (particularly for inductors) and the wires inside the wiring substrate because a low dielectric constant is desirable in order to reduce parasite capacities between the passive devices and wires. As described, two mutually conflicting requirements must be met by the ceramic material which constitutes the wiring substrate in order to achieve the goal of improved performance. In addition, for inductors embedded in the wiring substrate, there is a problem of decreased Q factor caused by parasite capacities. For these reasons, an MCM-C having its passive parts incorporated within the wiring substrate is sometimes not capable of performing sufficiently.

MCM-D uses a wiring substrate made of a base member provided by ceramic, silicon, glass or other material, as the base substrate for the entire module. A multilayer wiring structure is formed on the base member by means of thin-film layering technology. The multilayer wiring structure generally includes a plurality of thin-film wiring layers, insulating layers each separating mutually adjacent wiring layers, and vias which connect wiring layers. On a wiring substrate having such a multilayer wiring structure, device chips are mounted as bear chips. Passive parts are either mounted on the wiring substrate as individual products manufactured as surface mount devices, or built inside the multilayer wiring structure.

If a MCM-D is configured by using individual passive parts which are produced separately for surface mounting on a wiring substrate, it is sometimes impossible to accomplish sufficient size reduction of the module since surface mount type passive parts are relatively large as described above.

If an MCM-D is configured by using passive parts which are built inside the multilayer wiring structure, it is sometimes impossible for the module to perform sufficiently. In the multilayer wiring structure, spaces between the passive devices, wires, and space between a pair of electrodes in each capacitor are all filled with an insulation material (dielectric material) that constitutes the insulation layer. Although this is preferable for capacitors which are placed inside the multilayer wiring structure because a high dielectric constant of the resin material allows to obtain a large electrostatic capacity, it is not preferable for other passive devices (particularly for inductors) and the wires in the multilayer wiring structure because a low dielectric constant is desirable in order to reduce parasite capacities between passive devices and wires. As described, two mutually conflicting requirements must be met by the insulation material in the multilayer wiring structure resin based wiring substrate in order to achieve the goal of improved performance. In addition, for inductors embedded in the wiring substrate, there is a problem of decreased Q factor caused by parasite capacities. For these reasons, an MCM-D having its passive parts incorporated within the multilayer wiring structure are sometimes not capable of performing sufficiently.

SUMMARY OF THE INVENTION

The present invention has been proposed under the above-described circumstances, and it is therefore an object of the present invention to provide MCMs, i.e. electronic part modules, suitable for increased miniaturization and performance, and manufacturing methods.

A first aspect of the present invention provides an electronic part module. The electronic part module includes a wiring substrate, a passive device group including a plurality of passive devices formed on the wiring substrate and at least one device chip mounted on the wiring substrate. The passive devices formed on the wiring substrate are not those which are manufactured separately as surface mount devices for individual mounting on a wiring substrate, but are those built by e.g. micromachining technology, directly on the surface of the substrate through sequence of steps for forming portions of the passive devices on the wiring substrate. The electronic part module may include inductors, capacitors and resistors as the passive devices depending on a desired function of the module.

The passive devices of the electronic part module according to the present invention are formed into the wiring substrate, but not of a relatively large, surface-mountable type to be mounted on the wiring substrate. Therefore, the present electronic part module is suitable for providing passive devices within a small region on a surface of the substrate, and thus suitable for providing a passive device group which includes these passive devices and can constitute a predetermined passive circuit, within a small region on a surface of the substrate. Such an electronic part module is suitable for size reduction of the module itself.

The passive devices, which are formed on the surface of wiring substrate in the present electronic part module, are not buried in a dielectric material such as resin material or ceramic material. No dielectric material exists between two passive devices, or between a passive device and wiring (such as wiring on the wiring substrate surface). Therefore, according to the present electronic part module, it is possible to reduce parasite capacities which can appear between passive devices or between a passive device and wiring. Such a decrease in parasite capacities is preferred in view of increased performance of each passive device, particularly in view of increased Q factor when an inductor is included in the passive devices. As described above, the present electronic part module is suitable for increased performance. According to the present electronic part module, if the passive parts include a capacitor, there is a high level of freedom in selecting a highly dielectric material for the dielectric layer between a pair of electrodes in the capacitor. Here again, the present electronic part module is suitable for increased performance.

As described, the electronic part module according to the first aspect of the present invention is suitable for size reduction and performance improvement. Such an electronic part module contributes to size reduction and performance improvement in overall electronic equipment such as information processing equipment.

If the passive devices according to the present electronic part module include an inductor, the inductor is preferably a multi-coil inductor formed on the wiring substrate. Preferably, the multi-coil inductor has a plurality of coils disposed in tiers, and mutually adjacent coil wires are spaced from each other with a gap in between. More preferably, the multi-coil inductor has a plurality of spiral coils spaced from each other with a gap in between. Such a multi-coil inductor is suitable for obtaining a large inductance in the inductor, and suitable for obtaining a high Q factor of the inductor.

Preferably, the present electronic part module further includes three-dimensional wiring. The three-dimensional wiring includes a first wiring portion extended on the wiring substrate, a second wiring portion extended off the wiring substrate and along the wiring substrate, and a third wiring portion extended in a thickness direction of the wiring substrate. By appropriately combining these three kinds of wiring portions (the first through the third wiring portions), it is possible to connect a passive device with another passive device, or a passive device with a device chip with a lot of flexibility. In other words, the present electronic part module offers a-high level of freedom in designing the wiring between the components (passive devices and device chips) on the wiring substrate. A high level of freedom in the design of wiring on the wiring substrate offers advantages in minimizing the wire length between the components and in avoiding crossings between wires as well as between a wire and a passive device. Minimizing the wire length between components offers advantages in reducing high-frequency resistance in the wiring. Avoiding crossings between wires as well as between a wire and a passive device offers advantages in reducing induced electric current which is caused by electromagnetic-field mutual induction due to the crossing structure. The reduction in high-frequency resistance and the reduction in the induced current help decrease loss in the wire used to connect the components. Further, the reduced loss in the wire helps achieve a high Q factor and thereby accomplish performance improvement in the entire electronic part module.

According to a preferred embodiment, the device chip is above the passive device group. The present electronic part module enables one to dispose a plurality of passive devices highly densely as a passive device group within a predetermined region on the wiring substrate. Placing the device chip above such a passive device group enables one to overlap the device chip formation region and the region on the wiring substrate where the passive device group is formed. Therefore, the arrangement that the device chip is above the passive device group contributes to size reduction of the electronic part module.

According to another preferred embodiment, the wiring substrate has a recess, and the device chip is in the recess. According to still another preferred embodiment, the device chip is within the wiring substrate. These arrangements also contribute to size reduction of the electronic part module.

Preferably, at least one device chip includes a high-frequency filter. The high-frequency filter is preferably provided by one or a plurality of filters selected from a group consisting of SAW filter, FBAR filter and micromachine vibration filter. Further, preferably, at least one device chip includes a semiconductor device. The semiconductor device may have an amplifier for amplifying signals.

Preferably, the wiring substrate is provided by a multilayer wiring substrate including at least one inner wiring layer. Such an arrangement is preferred when disposing the device chips and the passive devices highly densely on the wiring substrate. In this case rewiring between the device is necessary. The rewiring between the device can be performed with the inner wiring layer. Some inductors which do not need a high Q factor also may be formed with inner wiring, thereby helping to reduce the transverse size of the module still more. According to a preferred embodiment, the multilayer wiring substrate is provided by a multilayer ceramic wiring substrate which includes a laminated plurality of ceramic layers. According to another preferred embodiment, the multilayer wiring substrate includes a laminated plurality of resin layers. Preferably, the wiring substrate provided by the multilayer wiring substrate includes a via which makes connection with an inner wiring layer. The via provides electric connection between inner wiring layers for example.

The wiring substrate may include a via which penetrates the wiring substrate. In this case, the wiring substrate may not necessarily have an inner wiring layer.

The present electronic part module may further include a sealing cap. As required, the present electronic part module has a sealing cap for sealing the device chip and the passive device group on the wiring substrate.

A second aspect of the present invention provides a method of making an electronic part module which includes a wiring substrate, a passive device group having a plurality of passive devices formed on the wiring substrate, and at least one device chip mounted on the wiring substrate. The method includes: a step of making a wiring substrate wafer including a plurality of electronic part module formation areas; a step of forming a plurality of passive devices in each of the electronic part module formation areas on the wiring substrate wafer; a step of mounting the device chips on each of the electronic part module formation areas on the wiring substrate wafer; and a step of dividing the wiring substrate wafer.

The present method enables one to appropriately manufacture the electronic part module according to the first aspect of the present invention. Further, the present method, which uses a wiring substrate wafer in place of e.g. a silicon wafer common in conventional methods, is suitable for mass production of the electronic part module according to the first aspect of the present invention.

Preferably, the method further includes a step of mounting a sealing cap on each of the electronic part module formation areas on the wiring substrate wafer. The sealing step performed at the wafer level as described is preferred in view of increased manufacturing efficiency of the electronic part module.

Other features and advantages of the present invention will become apparent from the detailed description given below with reference to the accompanying drawings.

DETAILED DESCRIPTION OF THE PREFERRED EMBODIMENTS

Figure 1:
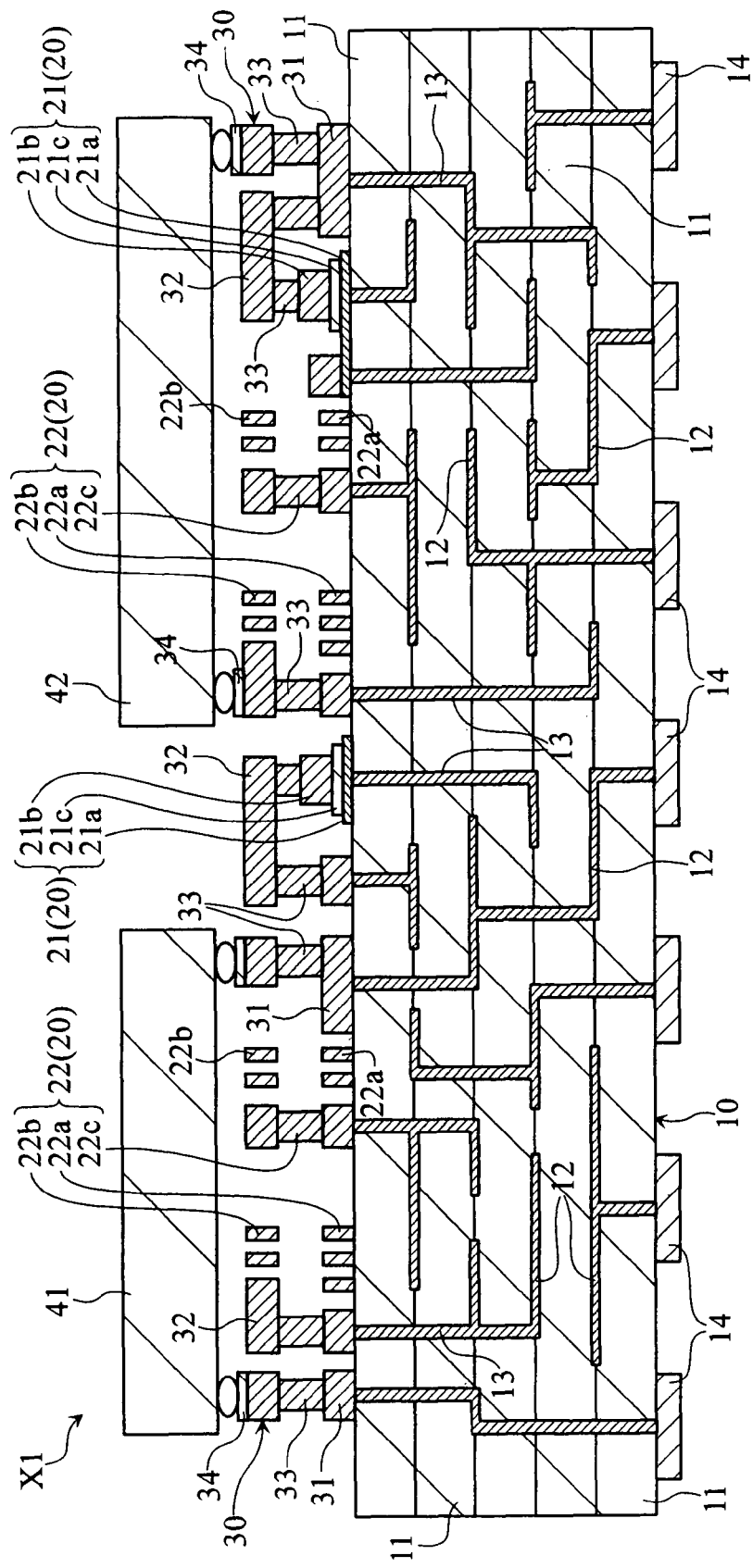
FIG. 1 is a sectional view of an electronic part module according to a first embodiment of the present invention.

FIG. 1 is a sectional view of an electronic part module X1 according to a first embodiment of the present invention. The electronic part module X1 includes a wiring substrate 10, a passive device group 20, three-dimensional wiring 30, and device chips 41, 42.

Figure 2:
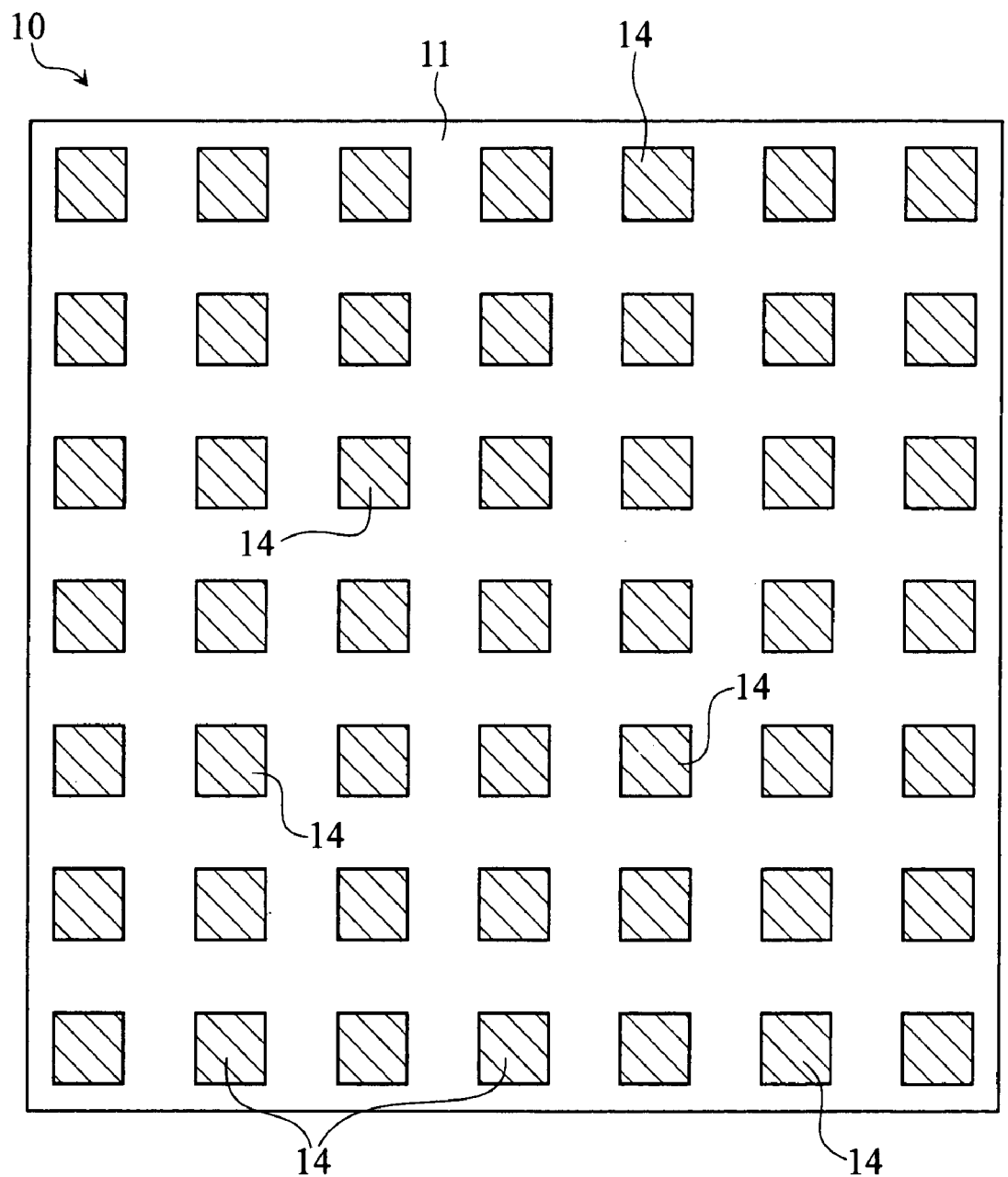
FIG. 2 is a plan view of a wiring substrate.

The wiring substrate 10 is a multilayer ceramic wiring substrate, and includes insulating layers 11, wiring patterns 12, vias 13 and external connection pads 14. Each insulating layer 11 is provided by a ceramic layer of e.g. $Al_2O_3$. Each wiring pattern 12 is formed of Cu, Ag, W or Mo for example, into a predetermined pattern between insulating layers 11. Each via 13 is formed of Cu, Ag, W or Mo, penetrates insulating layers 11 and makes a connection with a wiring pattern (s) 12. Some of the vias 13 provide connection between wiring patterns 12. Each pad 14 is formed of Cu for example, on one surface of the wiring substrate 10. The pads 14 may be made of Ni coated with a film of Au. The pads 14 are arrayed as in FIG. 2, on a surface of the wiring substrate 10 which faces away from an obverse surface of the wiring substrate 10 provided with the passive device group 20. The wiring substrate according to the present invention may not necessarily be a multilayer ceramic wiring substrate such as the wiring substrate 10 but may be a multilayer print wiring board. If a multilayer print wiring board is used, the insulating layers are formed of a backing material provided by glass cloth, carbon fiber, etc., and a resin material which surrounds the backing material, with the wiring patterns laid between these insulating layers.

The passive device group 20 includes a plurality of capacitors 21 and a plurality of inductors 22 formed on the wiring substrate 10. As shown in FIG. 1, each capacitor 21 has a laminate structure constituted by a first electrode 21a, a second electrode 21b and a dielectric layer 21c between the two. The first electrode 21a is provided on the wiring substrate 10 whereas the second electrode 21b is provided off the wiring substrate 10, along the wiring substrate 10. The first electrode 21a has, for example, a predetermined multilayer structure, and each layer in the multilayer structure contains a metal selected from Cu, Au, Ag, and Al. The first electrode 21a has a thickness of 0.2 through 3 μm for example. The second electrode 21b is made of Cu, Au, Ag or Al for example. The second electrode 21b has a thickness of 0.2 through 15 μm for example. The dielectric layer 21c is made of oxide silicon, silicon nitride, aluminum oxide, tantalum oxide or titanium oxide for example. The dielectric layer 21c has a thickness of 0.1 through 1 μm for example.

Figure 3:
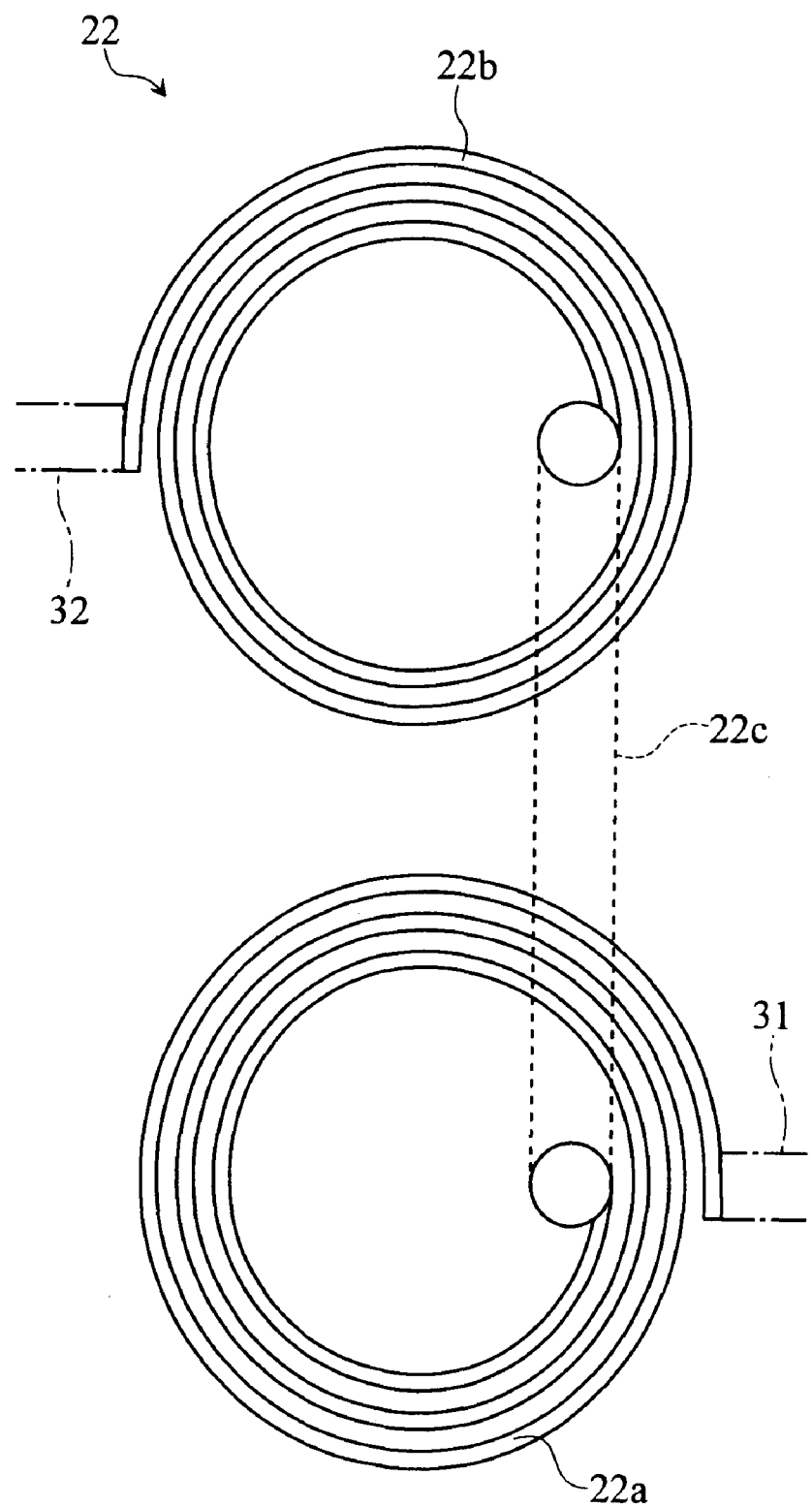
FIG. 3 is an exploded plan view of a multi-coil inductor.
Figure 4:
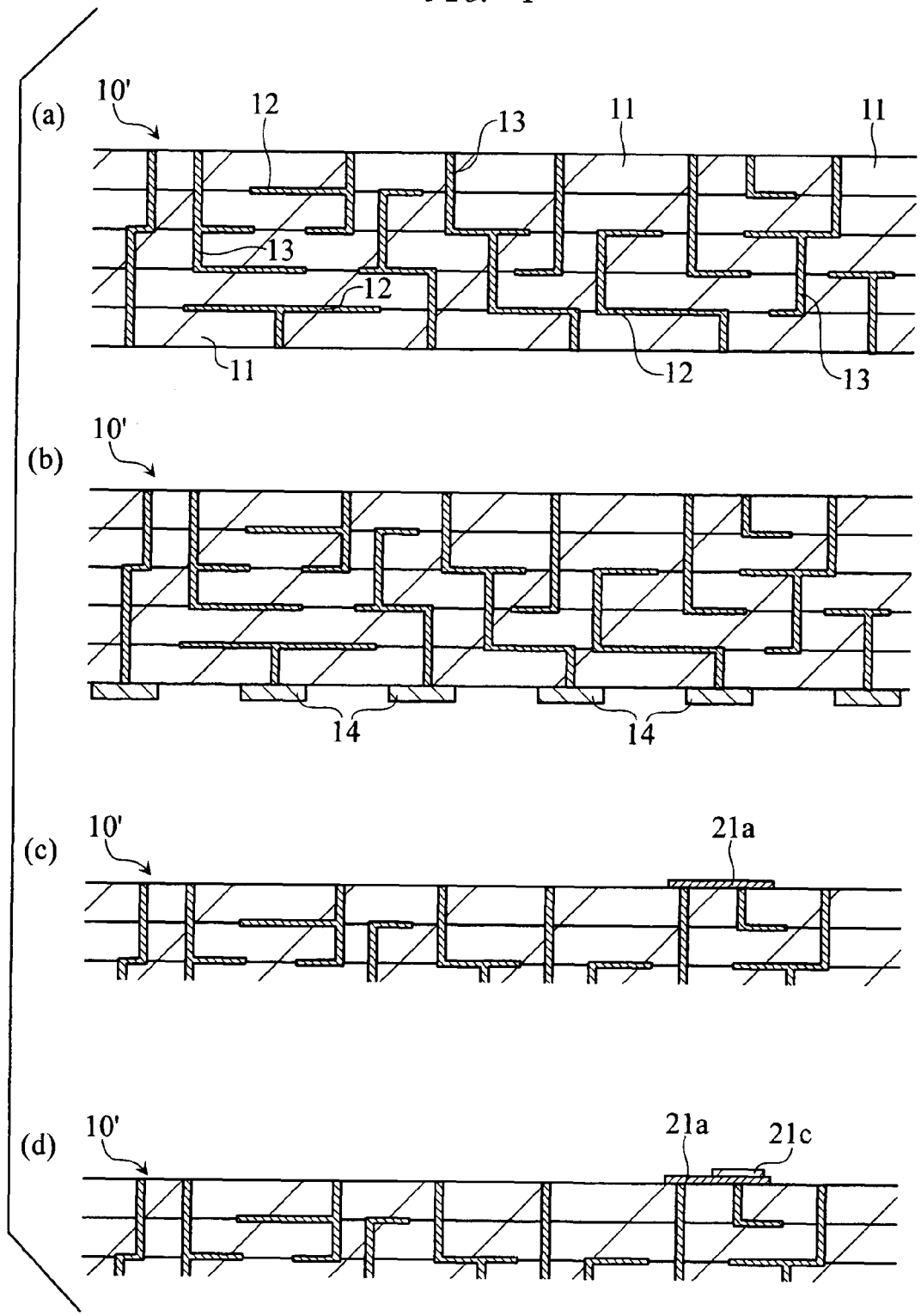
FIG. 4 shows a few steps in a method of manufacturing the electronic part module according to the first embodiment.
Figure 5:
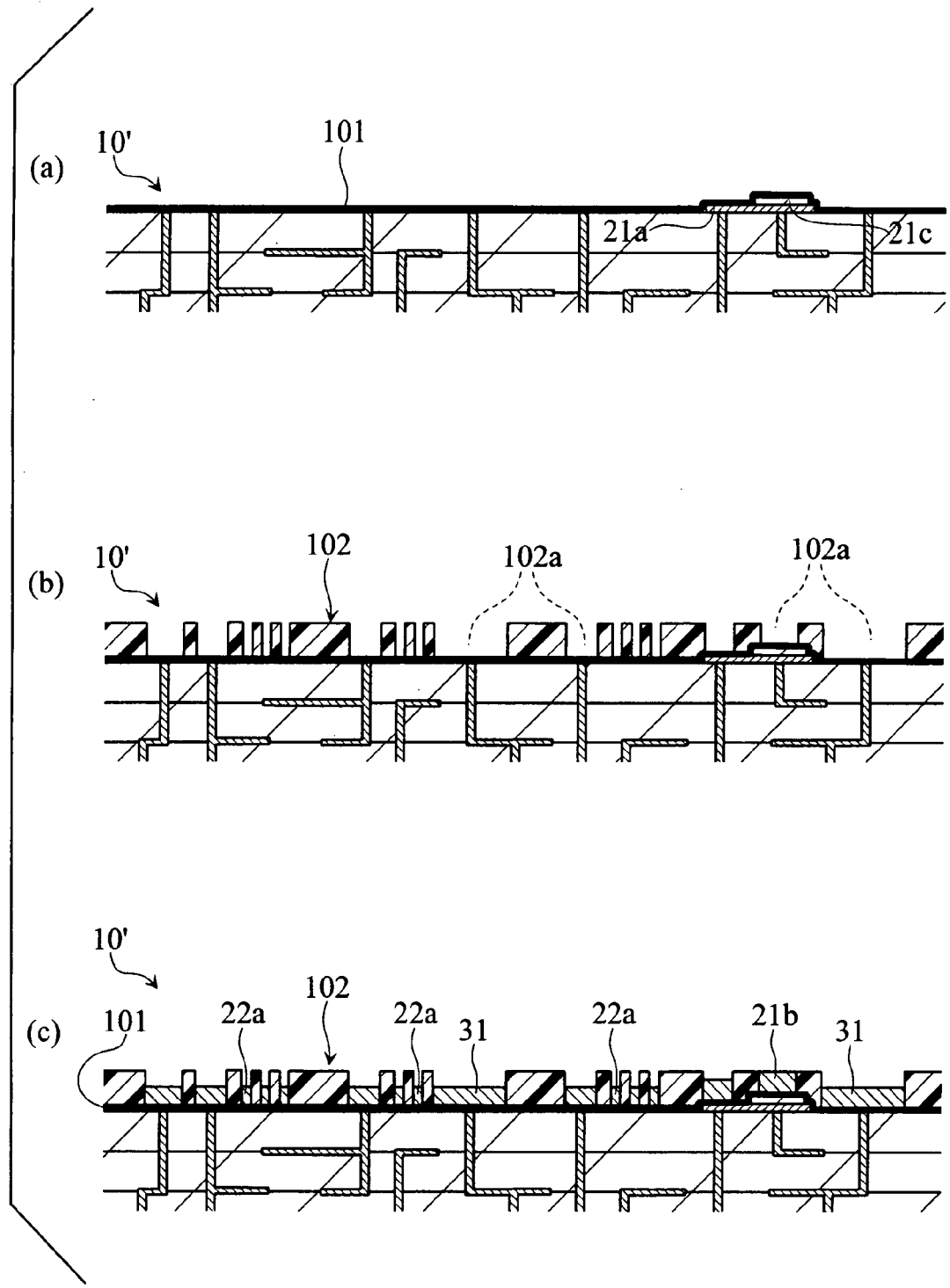
FIG. 5 shows a process continued from FIG. 4.
Figure 6:
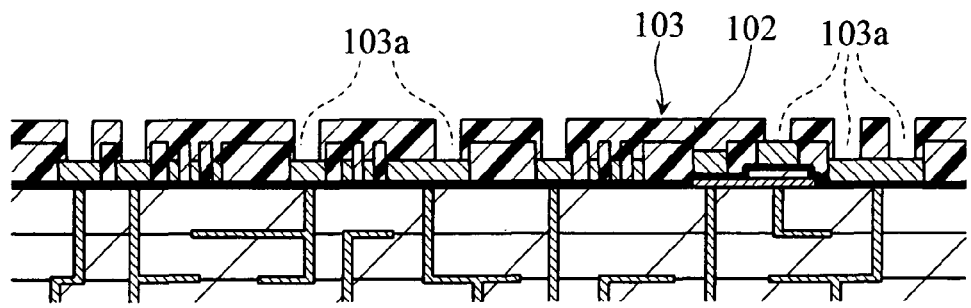
FIG. 6 shows a process continued from FIG. 5.
Figure 6:
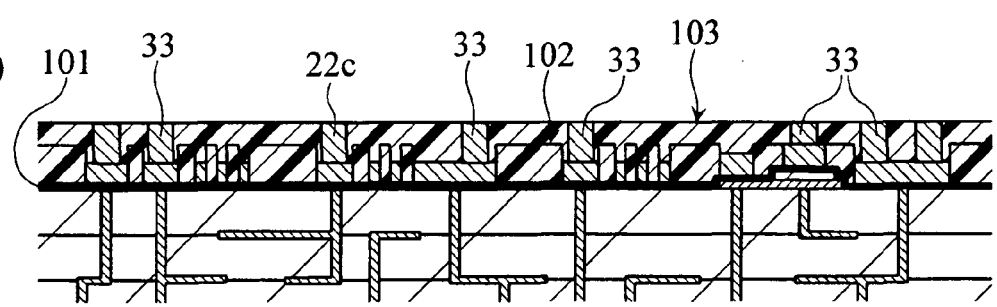
Figure 6:
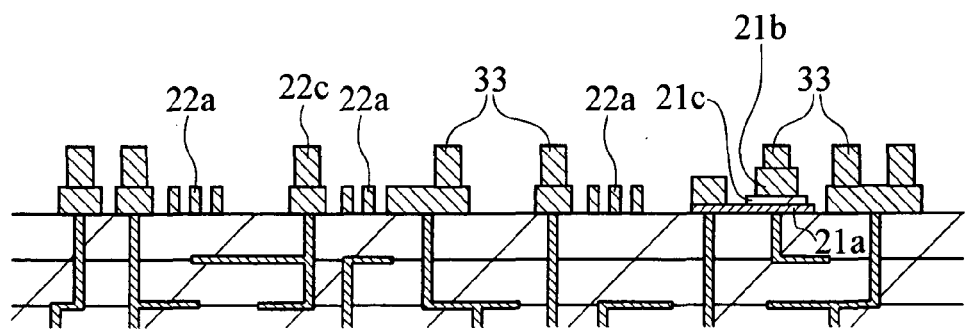
Figure 7:
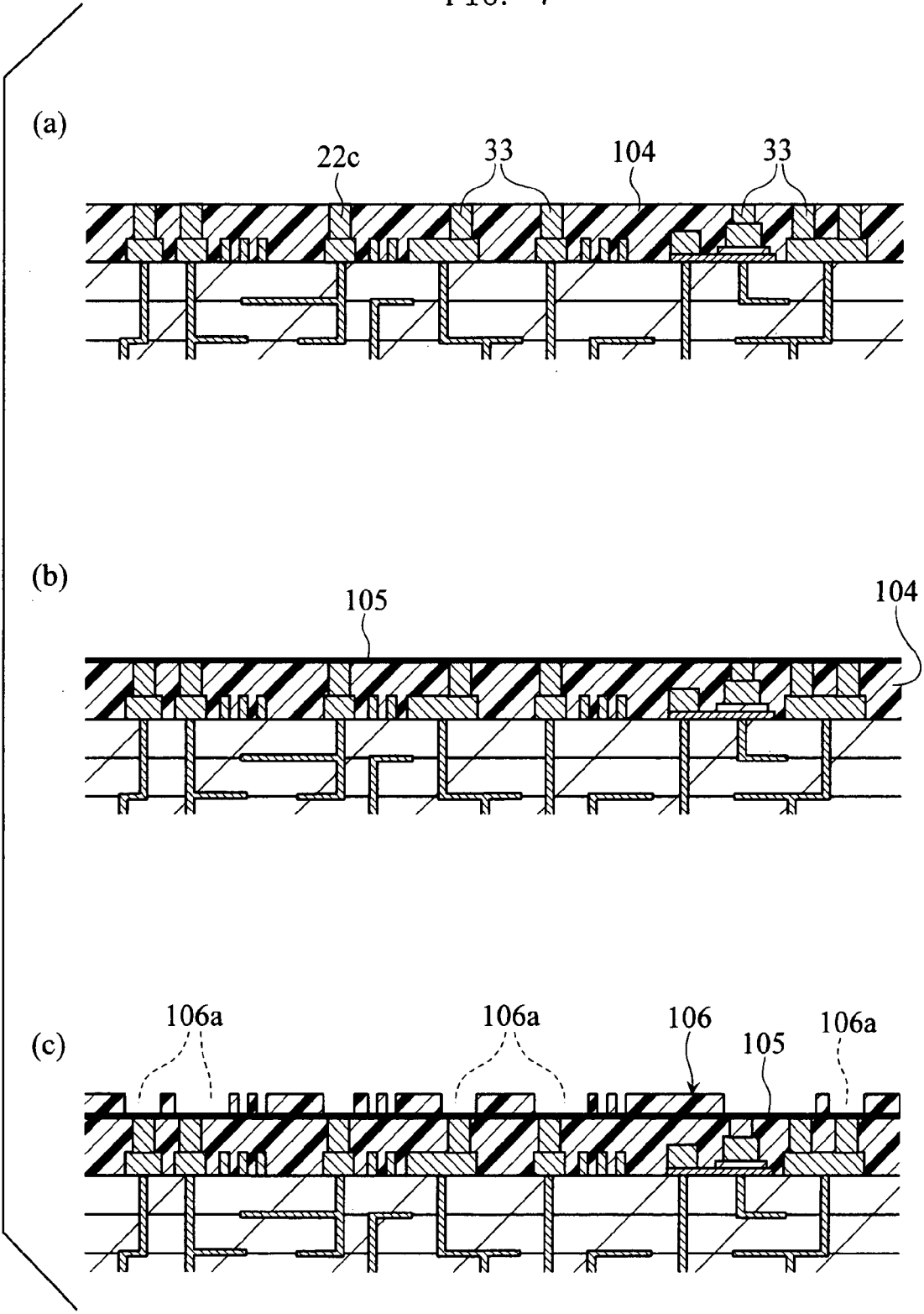
FIG. 7 shows a process continued from FIG. 6.
Figure 8:
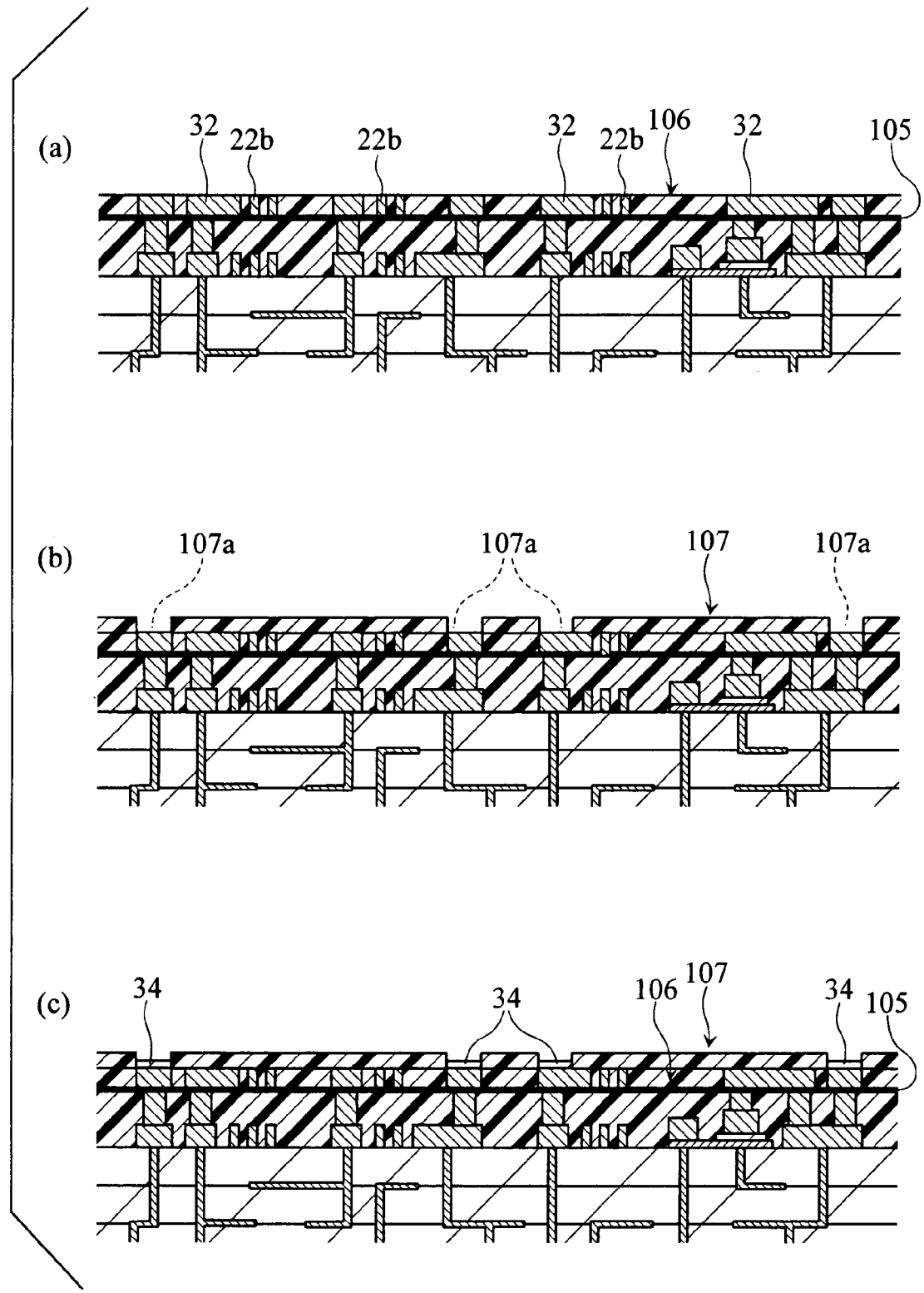
FIG. 8 shows a process continued from FIG. 7.
Figure 9:
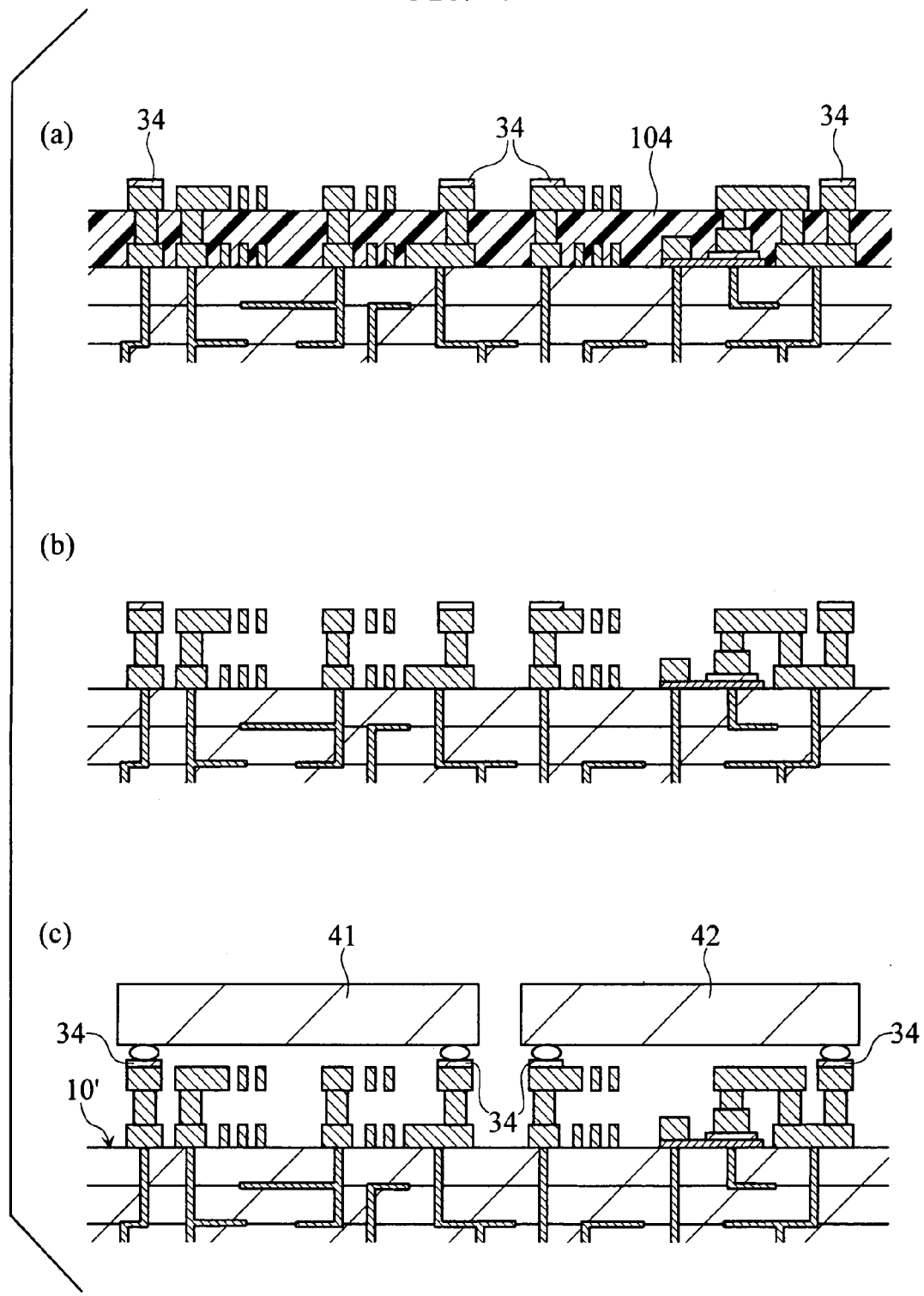
FIG. 9 shows a process continued from FIG. 8.

Each of the inductors 22 is a multi-coil inductor, and includes two tiers of spiral coils 22a, 22b and a connecting portion 22c which connects these in series. The spiral coil 22a is patterned on a surface of the wiring substrate 10 whereas the spiral coil 22b is off the wiring substrate 10. FIG. 3 is an exploded plan view of the multi-coil inductor 22. In each inductor 22, the spiral coils 22a, 22b are wound in such a way that the current which flows therein will flow in the same turning direction. Further, in each inductor 22, mutually adjacent coil wires are spaced from each other with a gap in between. The spiral coils 22a, 22b preferably have a thickness not smaller than 3 μm, and the distance between the spiral coils 22a, 22b of e.g. 1 through 100 μm. The inductors 22 as described are formed of Cu, Au, Ag or Al for example.

The passive device group 20 may include resistors made from a predetermined high-resistance material, as passive devices formed on the wiring substrate 10 in addition to these capacitors 21 and inductors 22.

The three-dimensional wiring 30 provides electrical connection between the components (capacitors 21, inductors 22, device chips 41, 42) on the wiring substrate 10, as well as between each component and the wiring substrate 10, and includes a first wiring portion 31 which has a part extended on the wiring substrate 10, a second wiring portion 32 extended off the wiring substrate 10 and along the wiring substrate 10, a third wiring portion 33 extended in a thickness direction of the wiring substrate 10, and pads 34. The three-dimensional wiring 30 is formed of Cu, Au, Ag or Al for example. The first wiring portion 31 and the second wiring portion 32 have a thickness not smaller than 3 μm preferably.

Each of the device chips 41, 42 are mounted as a bear chip on the wiring substrate 10, with its bump electrodes bonded to the pads 34 of the three-dimensional wiring 30. In the present embodiment, the device chips 41, 42 are located above the passive device group 20. In other words, the region where the passive device group 20 is formed and the region where the device chips 41, 42 are formed overlap with each other in the wiring substrate 10. The device chips 41, 42 have predetermined functions in accordance with the design of electronic part module X1. For example, the device chips 41, 42 constitute a high-frequency filter. The high-frequency filter is constituted by one or a plurality of filters selected from a group consisting of SAW filter, FBAR filter, and micromachine vibration filter for example. The device chips 41, 42 may be semiconductor devices. The semiconductor devices have e.g. an amplifier for amplifying signals.

FIG. 4 through FIG. 9 show a manufacturing method of the electronic part module X1. FIG. 4 through FIG. 9 show the manufacturing process of the electronic part module X1 in a series of sectional views. The section featured in the figures is a conceptual composite collected from a plurality of fragmentary sections of a region in a material wafer from which a single electronic part module is made.

In the manufacture of the electronic part module X1, first, a wiring substrate wafer 10' as shown in FIG. 4(a) is made. The wiring substrate wafer 10' has a multilayer wiring structure including insulating layers 11, wiring patterns 12 and vias 13, and has a plurality of electronic part module, formation regions. The electronic part module X1 is rectangular for example, having side lengths of 1 through 10 mm and a thickness of 500 through 1000 μm. The wiring substrate wafer 10' has a surface for formation of the above-described passive device group 20, and the surface has a surface roughness Rz not greater than 0.2 μm.

In the manufacture of the wiring substrate wafer 10', first, openings for formation of vias are made in each ceramic substrate which is provided as a green sheet. Then, the via formation openings are filled with electrically conductive paste, and a wiring pattern is printed by using electrically conductive paste on a surface of the ceramic substrate. A predetermined number of ceramic substrates prepared through these processes are then laminated, and the laminated body is pressed in its thickness direction under heat. Thereafter, a predetermined thermal process is conducted to sinter the laminated body into an integrated pre-wiring substrate wafer 10' (The wiring patterns 12 and vias 13 are formed through the sintering).

Continuing with the manufacture of wiring substrate wafer 10', next, lapping is performed to both surfaces of the pre-wiring substrate wafer 10". The lapping may be mechanical lapping with a predetermined lapping agent (chemical liquid). The lapping process reduces warpage and undulation in the pre-wiring substrate wafer 10". The lapping process should preferably decrease warpage to a level not greater than 40 μm, and undulation to an appropriate minimum.

The next process in the manufacture of the wiring substrate wafer 10' is smoothening of the pre-wiring substrate wafer 10", performed to the surface for formation of the passive device group 20. The surfaces of the pre-wiring substrate wafer 10" after the previous process has roughness (apparently due to the grain size of material ceramic as well as the grinding action with the lapping agent). Optimum selection of the ceramic material properties and lapping method still leave the surfaces of the pre-wiring substrate wafer 10" with a surface roughness Rz not very much lower than 5 μm, and it is not possible to appropriately build those tiny passive devices included in the passive device group 20 on a surface having such a roughness. For example, if the capacitor 21 is to be built on a surface which has a surface roughness Rz of about 5 μm, it is clear that the first electrode 21a and the dielectric layer 21c are too thin to be formed in an appropriate flatness on the rough surface. If it is impossible to achieve an appropriately uniform thickness in the dielectric layer 21c, it becomes impossible to ensure sufficient pressure characteristics of the capacitor 21. In order to avoid such a problem, a predetermined smoothening process must follow the above-described lapping process in the manufacture of the wiring substrate wafer 10'.

Figure 10:
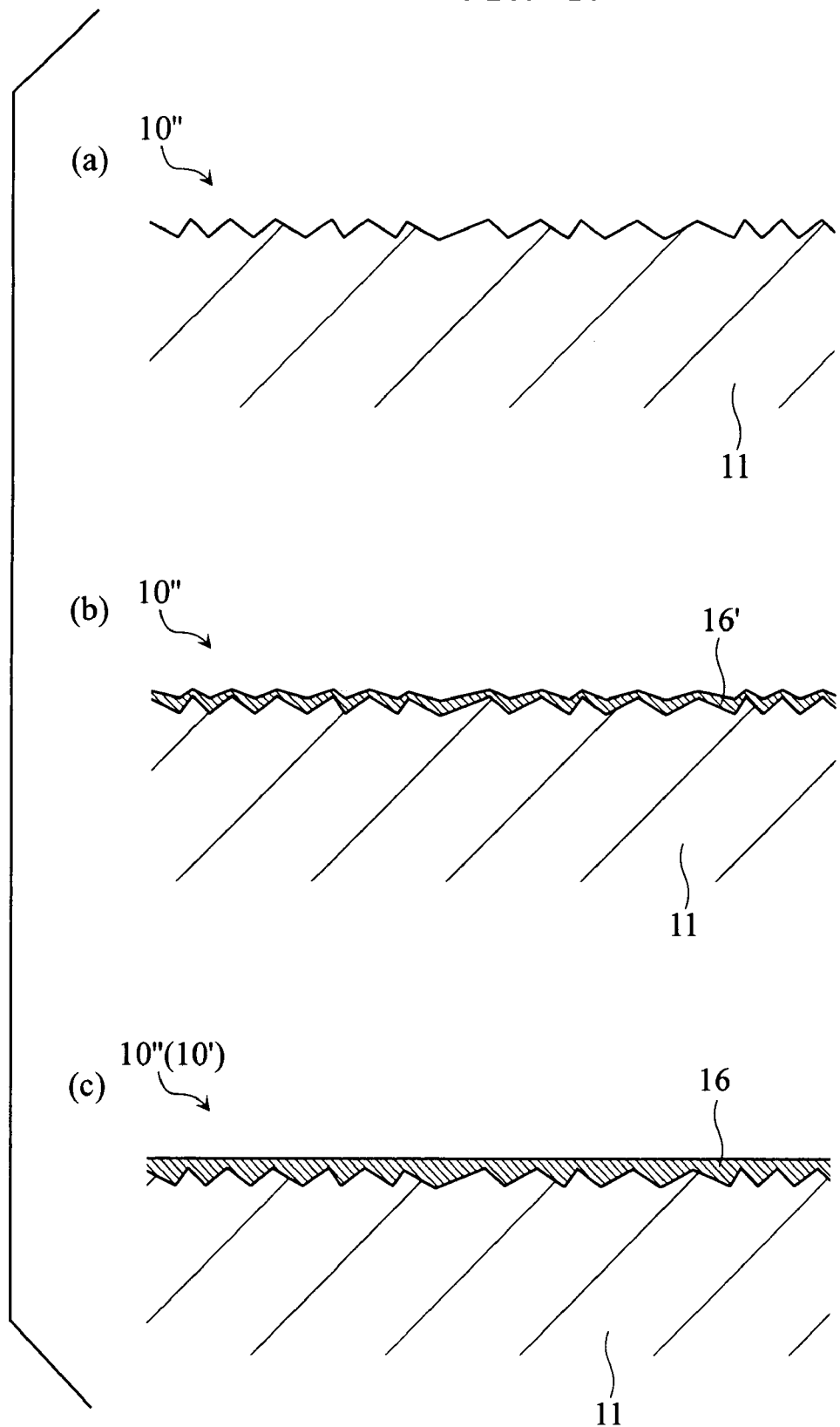
FIG. 10 shows a smoothening process.

FIG. 10 illustrates the smoothening process. FIG. 10 is an enlarged partial sectional view including the surface of the pre-wiring substrate wafer 10" to which the smoothening process is performed. Before the smoothening process, the surface of the pre-wiring substrate wafer 10" or the surface insulating layer 11 as after the above-described lapping process is like in FIG. 10(a). On this rough surface, a thin insulation film 16' is formed as shown in FIG. 10(b). The insulation film 16' is formed by applying and then baking a thin coating of insulation liquid on the surface of the pre-wiring substrate wafer 10". The insulation liquid may be provided by SOG (Spin-on-Glass). The insulation coating liquid is applied to a thickness not greater than 1 μm for example. By forming a thin insulation film 16' in such a way, surface roughness on the pre-wiring substrate wafer 10" can be decreased. The insulation film formation step is repeated for a predetermined number until the projections on the ceramic surface in the pre-wiring substrate wafer 10" are buried as shown in FIG. 10(c), in an insulation film 16 provided by a plurality of the insulation films 16' (Note that the insulation film 16 is shown only in FIG. 10). Through such a method as shown in FIG. 10, it is possible to decrease the surface roughness Rz to a level not greater than 0.02 μm over the entire surface of the pre-wiring substrate wafer 10" for formation of the passive device group 20. The wiring substrate wafer 10' is obtained by performing such a smoothening process which follows the above-described lapping process.

Figure 11:
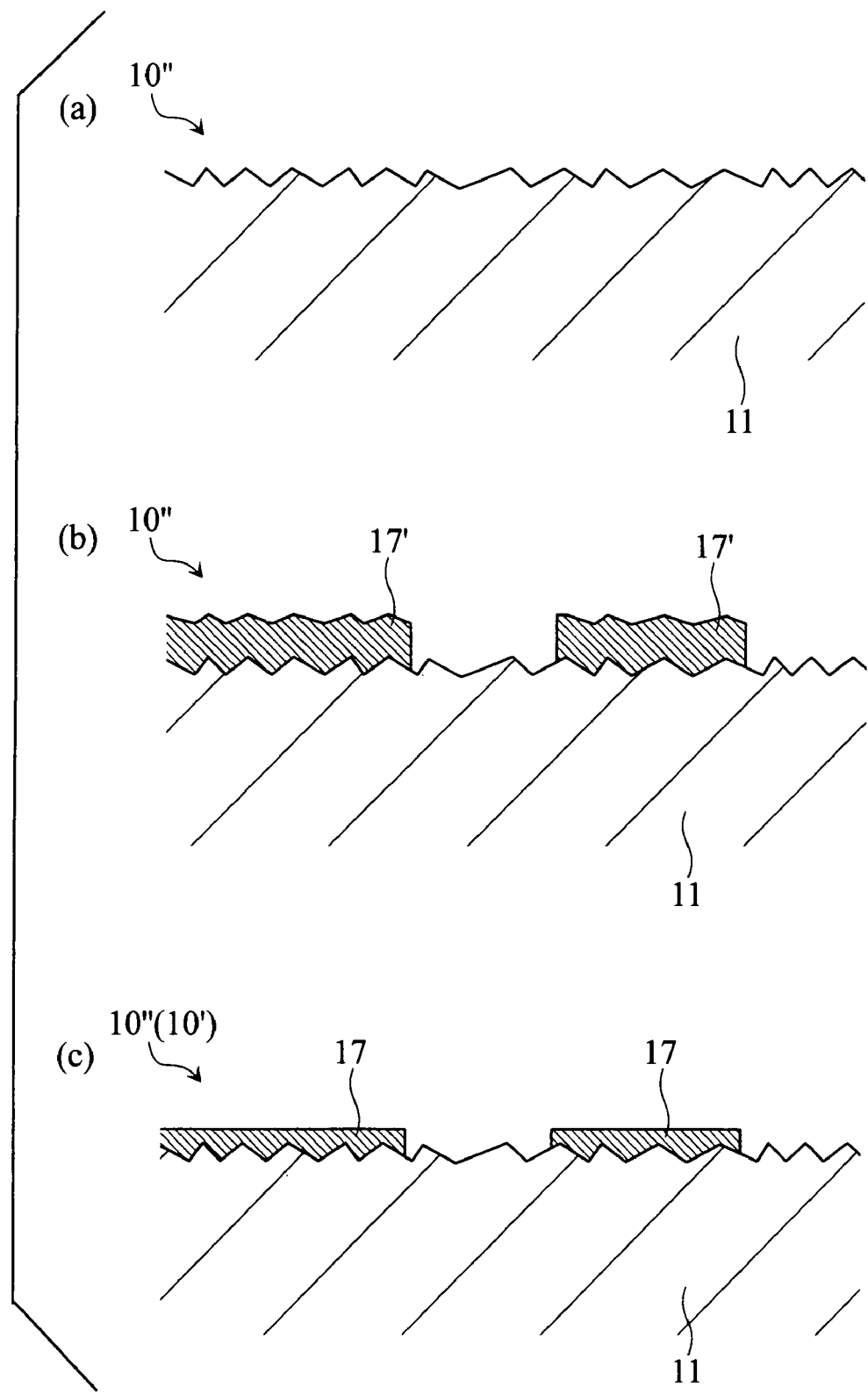
FIG. 11 shows another smoothening process.

FIG. 11 illustrates another smoothening process. FIG. 11 is an enlarged partial sectional view including the surface of the pre-wiring substrate wafer 10" to which the smoothening process is performed. This smoothening process also starts with the rough surface of the insulating layer 11, i.e. the surface of the pre-wiring substrate wafer 10". On this surface, a thick metal film 17' is formed as shown in FIG. 11(b). The metal film 17' is formed at each place where a passive device included in the passive device group 20 is to be built, by nonelectrolytic plating or electrolytic plating for example. The metal film 17' has a thickness of 20 μm for example. In this way, the projections on the ceramic surface in the pre-wiring substrate wafer 10" are buried in the metal film 17'. Next, the metal film 17' is lapped into a metal film 17 which has a flattened surface as shown in FIG. 11(c) (Note that the metal film 17 is shown only in FIG. 11). The lapping may be mechanical lapping with a predetermined lapping agent (chemical liquid). Through such a method as shown in FIG. 11, it is possible to decrease the surface roughness Rz to a level not greater than 0.02 μm at each place in the surface of the pre-wiring substrate wafer 10" where formation of the passive device is to be performed.

In the manufacture of electronic part module X1, next, pads 14 are formed as shown in FIG. 4(b) on one surface of the wiring substrate wafer 10'. The pads 14 can be formed by, e.g. first spattering to form a film of predetermined metal on the wiring substrate wafer 10', and then patterning the metal film by predetermined wet etching or dry etching. Alternatively, the pad 14 may be formed by nonelectrolytic plating or electrolytic plating.

Next, as shown in FIG. 4(c), the first electrode 21a of the capacitor 21 is formed on the wiring substrate wafer 10'. The first electrode 21a can be formed by, e.g. first spattering to form a film of predetermined metal material on the wiring substrate wafer 10', and then patterning the metal film by predetermined wet etching or dry etching.

Next, as shown in FIG. 4(d), a dielectric layer 21c of the capacitor 21 is formed on the first electrode 21a. The dielectric layer 21c can be formed by, e.g. first spattering to form a film of a predetermined dielectric material at least on the first electrode 21a, and then patterning the dielectric film by predetermined wet etching or dry etching.

Next, as shown in FIG. 5(a), a seed layer 101 (represented by a thick line) for electrolytic plating is formed on the wiring substrate wafer 10' to cover the first electrode 21a and the dielectric layer 21c. The seed layer 101 has a laminate structure provided by e.g. a Ti film and an Au film thereon, a Cr film and an Au film thereon, a Ti film and a Cu film thereon, or a Cr film and a Cu film thereon. The seed layer 101 may be formed by deposition method or spattering method.

Next, as shown in FIG. 5(b), a resist pattern 102 is formed for formation of a first-tier thick conductor portion. The first-tier thick conductor portion includes the second electrode 21b of the capacitor 21, the spiral coil 22a of the inductor 22, and the first wiring portion 31 of the three-dimensional wiring 30. The resist pattern 102 has openings 102a for patterning the first-tier thick conductor portion. In forming the resist pattern 102, first, a film of photoresist is formed on the wiring substrate wafer 10' by spin-coating a liquid photoresist. Next, exposing process and developing process are performed to pattern the photoresist film. Examples of the photoresist include AZP4210 (manufactured by AZ Electronic Materials) and AZ1500 (manufactured by AZ Electronic Materials). Other resist patterns to be described later can also be formed through essentially the same processes of photoresist film formation followed by exposure and development processes.

Next, as shown in FIG. 5(c), electrolytic plating is performed to form the first-tier thick conductor portion (which includes the second electrode 21b, the spiral coil 22a and the first wiring portion 31) in the openings 102a of the resist pattern 102. When performing the electrolytic plating, electric current is applied to the seed layer 101.

Next, as shown in FIG. 6(a), a resist pattern 103 is formed on the resist pattern 102 for formation of a second-tier thick conductor portion. The second-tier thick conductor portion includes the connecting portion 22c of the inductor 22 and the third wiring portion 33 of the three-dimensional wiring 3. The resist pattern 103 has openings 103a for patterning the second-tier thick conductor portion.

Next, as shown in FIG. 6(b), electrolytic plating is performed to form the second-tier thick conductor portion (which includes the connecting portion 22c and the third wiring portion 33) in the openings 103a of the resist pattern 103. When performing the electrolytic plating, electric current is applied to the seed layer 101.

Next, as shown in FIG. 6(c), the resist patterns 102, 103 are removed with a remover for example, and after the removal, exposed portions of the seed layer 101 are removed (non-exposed portions of the seed layer 101 will no longer be illustrated in figures after FIG. 6(c)). An example of the remover is AZ Remover 700 (manufactured by AZ Electronic Materials). Resist patterns to be described later are also removed by the same removing method as for the resist patterns 102, 103.

Next, a resist pattern 104 is formed as shown in FIG. 7(a). The resist pattern 104 serves as a sacrifice layer for formation of a third-tier thick conductor portion on the second-tier thick conductor portion. The Third-tier thick conductor portion includes the spiral coil 22b of the inductor 22 and the second wiring portion 32 of the three-dimensional wiring 30.

Next, as shown in FIG. 7(b), a seed layer 105 (represented by a thick line) is formed on the surface of the resist pattern 104 and exposed surfaces of the second-tier thick conductor portion. The seed layer 105 has the same construction and is formed in the same way as the seed layer 101 described earlier.

Next, as shown in FIG. 7(c), a resist pattern 106 is formed for formation of the third-tier thick conductor portion. The resist pattern 106 has openings 106a for patterning the third-tier thick conductor portion (which includes the spiral coil 22b and the second wiring portion 32).

Next, as shown in FIG. 8(a), electrolytic plating is performed to form the third-tier thick conductor portion (which includes the spiral coil 22b and the second wiring portion 32) in the openings 106a of the resist pattern 106. When performing the electrolytic plating, electric current is applied to the seed layer 105.

Next, as shown in FIG. 8(b), a resist pattern 107 is formed. The resist pattern 107 has openings 107a for patterning the pads 34 of the three-dimensional wiring 30.

Next, as shown in FIG. 8(c), electrolytic plating is performed to form the pads 34 in the openings 107a of the resist pattern 107. When performing the electrolytic plating, electric current is applied to the seed layer 105.

Next, as shown in FIG. 9(a), the resist patterns 106, 107 are removed, and after the removal, exposed portions of the seed layer 105 are removed (non-exposed portions of the seed layer 105 will no longer be illustrated in figures after FIG. 9(c)). Thereafter, the resist pattern 104 is removed as shown in FIG. 9(a).

Next, as shown in FIG. 9(c), device chips 41, 42 are mounted. In this step, each device chip has its bump electrodes aligned onto their corresponding pads 34, and then the bump electrodes and the pads 34 are bonded to each other. If the bump electrodes of the device chips 41, 42 are Au stud bumps for example, then ultrasonic method is used for the bonding. If the bump electrodes of the device chips 41, 42 are solder bumps for example, a predetermined heating process is employed for the bonding.

Next, dicing is performed to cut the wiring substrate wafer 10' into a plurality of electronic part modules X1. Following the above-described process, a batch production of the electronic part module X1 is possible.

The passive devices in the electronic part module X1, i.e. the capacitors 21 and the inductors 22 are formed on the wiring substrate 10. They are not surface mount devices which are relatively large or mounted individually on the wiring substrate 10. Therefore, the electronic part module X1 is suitable for providing its passive devices in a small region on the substrate, and thus suitable for providing its passive device group 20, which includes these passive devices and can constitute a predetermined passive circuit, in a small region on the substrate. The electronic part module X1 as described has an advantage that the module itself can be made small.

The passive devices in the electronic part module X1, i.e. the capacitors 21 and the inductors 22, as well as the three-dimensional wiring 30 are not buried in a dielectric material such as resin material or ceramic material. No dielectric material exists between two passive devices, or between a passive device and the three-dimensional wiring 30. Therefore, according to the electronic part module X1, it is possible to reduce parasite capacities which can appear between passive devices or between a passive device and the three-dimensional wiring 30. Such a decrease in parasite capacities is preferred in view of increased performance of each passive device, particularly in view of increased Q factor of the inductor 22. In addition, the electronic part module X1 allows a high level of freedom in selecting a highly dielectric material for the dielectric layer 21c of the capacitor 21. Therefore, the electronic part module X1 is suitable for performance improvement.

As described, the electronic part module X1 is suitable for size reduction and performance improvement. Thus the electronic part module X1 contributes to size reduction and performance improvement of the entire electronic equipment such as information processing apparatuses which incorporate the module.

In addition, the electronic part module X1 includes the wiring substrate 10 as a base substrate for the entire module which has the pads 14 for external connection, on a side facing away from the side provided with the passive device group 20. Thus, the module does not require a wiring substrate (such as a multilayer wiring substrate) when mounted onto a system substrate or a mother substrate which supports the entire system incorporating the module. The electronic part module X1 as the above contributes to size reduction of the system.

Figure 12:
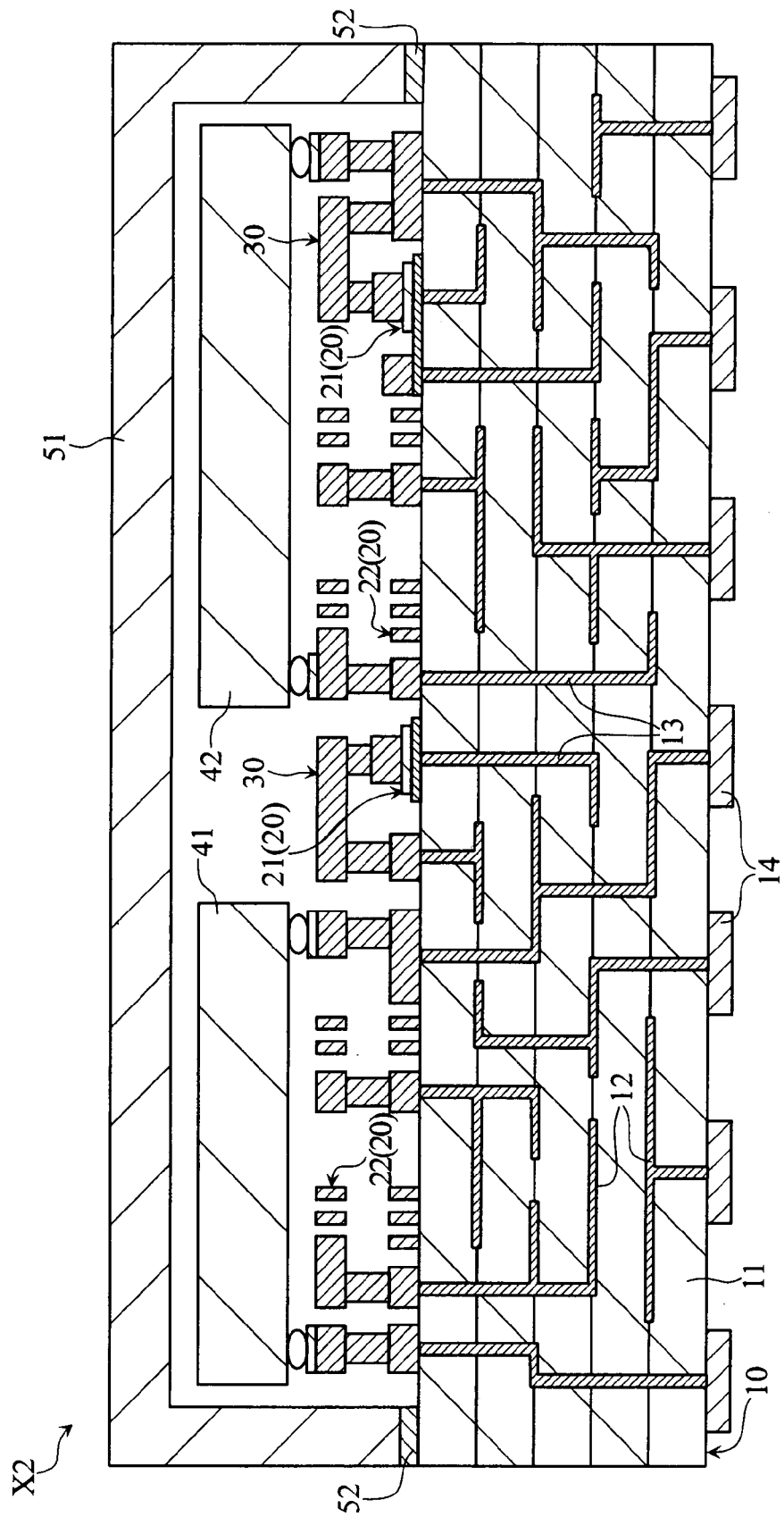
FIG. 12 is a sectional view of an electronic part module according to a second embodiment of the present invention.

FIG. 12 is a sectional view of an electronic part module X2 according to a second embodiment of the present invention. The electronic part module X2 differs from the electronic part module X1 in that it further includes a sealing cap 51. The sealing cap 51 is made of a metal material or a ceramic material for example. The sealing cap 51 provides air-tight sealing over the passive device group 20, the three-dimensional wiring 30 and the device chips 41, 42 on the wiring substrate 10.

The electronic part module X2 can be manufactured by the same method as for the electronic part module X1, with an additional step (sealing step) of mounting the sealing cap 51 onto the wiring substrate wafer 10' after the device chip mounting step described with reference to FIG. 9(c) and before the dicing step. In the sealing step, the sealing cap 51 is bonded to the wiring substrate wafer 10' (the wiring substrate 10) via a sealing material 52. The sealing material 52 is provided by solder, glass frit or resin material for example. The sealing step performed at the wafer level as described is preferred in view of increased manufacturing efficiency of the electronic part module X2.

According to the electronic part module X2 as the above, it is possible to enjoy the same technical advantages as described in relation with the electronic part module X1. In addition, according to the electronic part module X2, the sealing cap 51 provides air-tight sealing for passive device group 20, the three-dimensional wiring 30 and the device chips 41, 42 on the wiring substrate 10, as described earlier.

Figure 13:
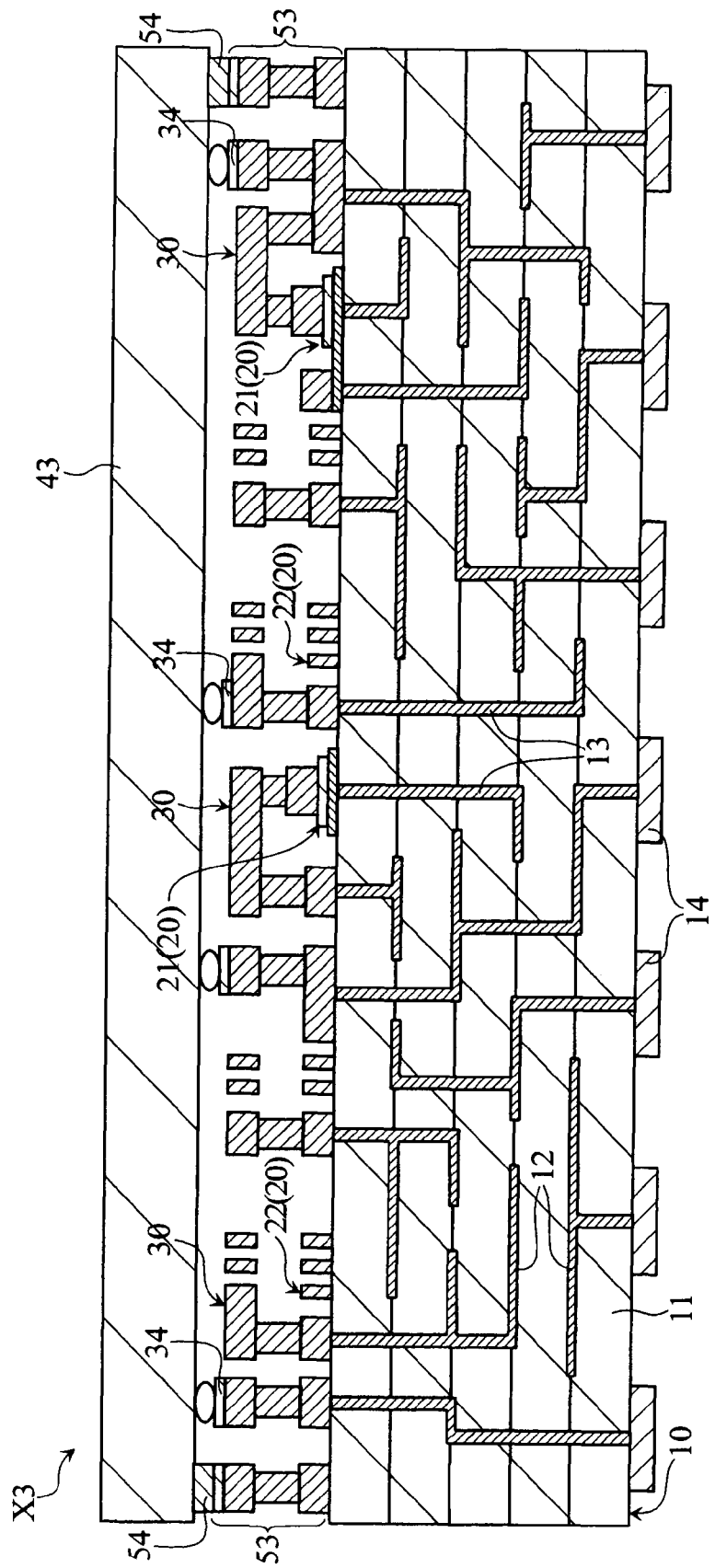
FIG. 13 is a sectional view of an electronic part module according to a third embodiment of the present invention.

FIG. 13 is a sectional view of an electronic part module X3 according to a third embodiment of the present invention. The electronic part module X3 differs from the electronic part module X1 in that it includes a device chip 43 in place of the device chips 41, 42, and further includes a peripheral wall 53. The device chip 43 is a one-chip version of a plurality of device chips (such as the device chips 41, 42), and is mounted so as to cover the passive device group 20 and the three-dimensional wiring 30 entirely on the wiring substrate 10. The peripheral wall 53 is formed to surround the perimeter of the passive device group 20 on the wiring substrate 10. The device chip 43 is fixed to the wiring substrate 10 via the three-dimensional wiring 30 and via the peripheral wall 53 as well. The peripheral wall 53 is made of a metal material for example. The device chip 43 and the peripheral wall 53 as described provide air-tight sealing for the passive device group 20 and the three-dimensional wiring 30 on the wiring substrate 10, with the device chip 43 serving as a sealing cap.

The electronic part module X3 can be manufactured by the same method as for the electronic part module X1, with slight changes that the peripheral wall 53 be formed, and that the device chip 43 be mounted in place of the device chips 41, 42 in the mounting step. The peripheral wall 53 can be formed at the same time as the three-dimensional wiring 30, on the wiring substrate wafer 10'. In the mounting step, bump electrodes of the device chip 43 are bonded to the pads 34, and the device chip 43 is also bonded to the peripheral wall 53 via a sealing material 54. The sealing material 54 is provided by solder, glass frit or resin material for example. The sealing step performed at the wafer level as described is preferred in view of increased manufacturing efficiency of the electronic part module X3.

The electronic part module X3 as described offer the same technical advantages as has been described in relation to the electronic part module X1. In addition, according to the electronic part module X3, the device chip 43 serves as a sealing cap as described, and the device chip 43 and the peripheral wall 53 provide air-tight sealing for the passive device group 20 and the three-dimensional wiring 30 on the wiring substrate 10.

Figure 14:
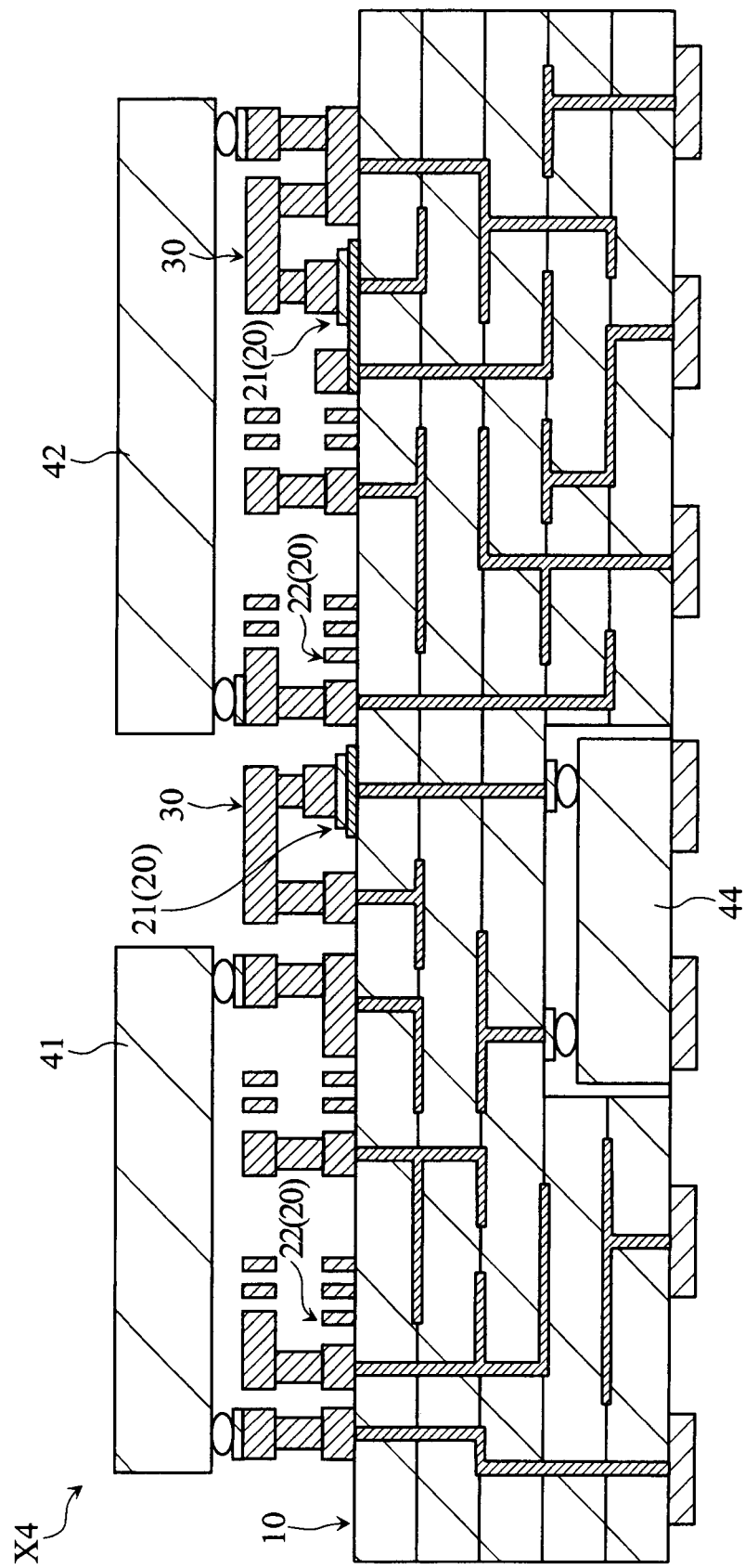
FIG. 14 is a sectional view of an electronic part module according to a fourth embodiment of the present invention.

FIG. 14 is a sectional view of an electronic part module X4 according to a fourth embodiment of the present invention. The electronic part module X4 differs from the electronic part module X1 in that it further includes a device chip 44 in a predetermined recess of the wiring substrate 10. The electronic part module according to the present invention may also have such an arrangement in mounting the device chips.

Figure 15:
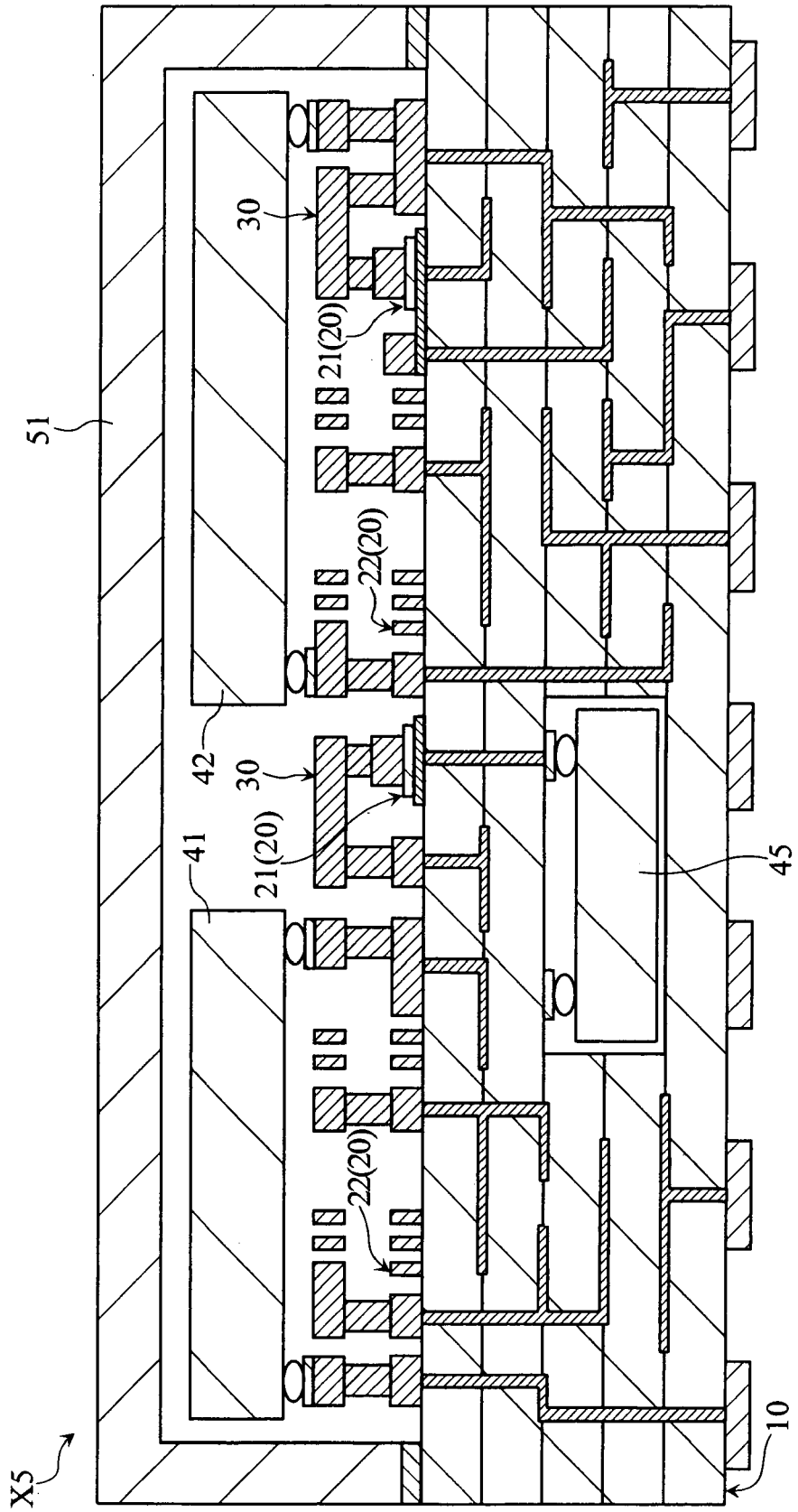
FIG. 15 is a sectional view of an electronic part module according to a fifth embodiment of the present invention.

FIG. 15 is a sectional view of an electronic part module X5 according to a fifth embodiment of the present invention. The electronic part module X5 differs from the electronic part module X2 in that it further includes a device chip 45 which is incorporated in the wiring substrate 10. The electronic part module according to the present invention may also have such an arrangement in mounting the device chips.

Figure 16:
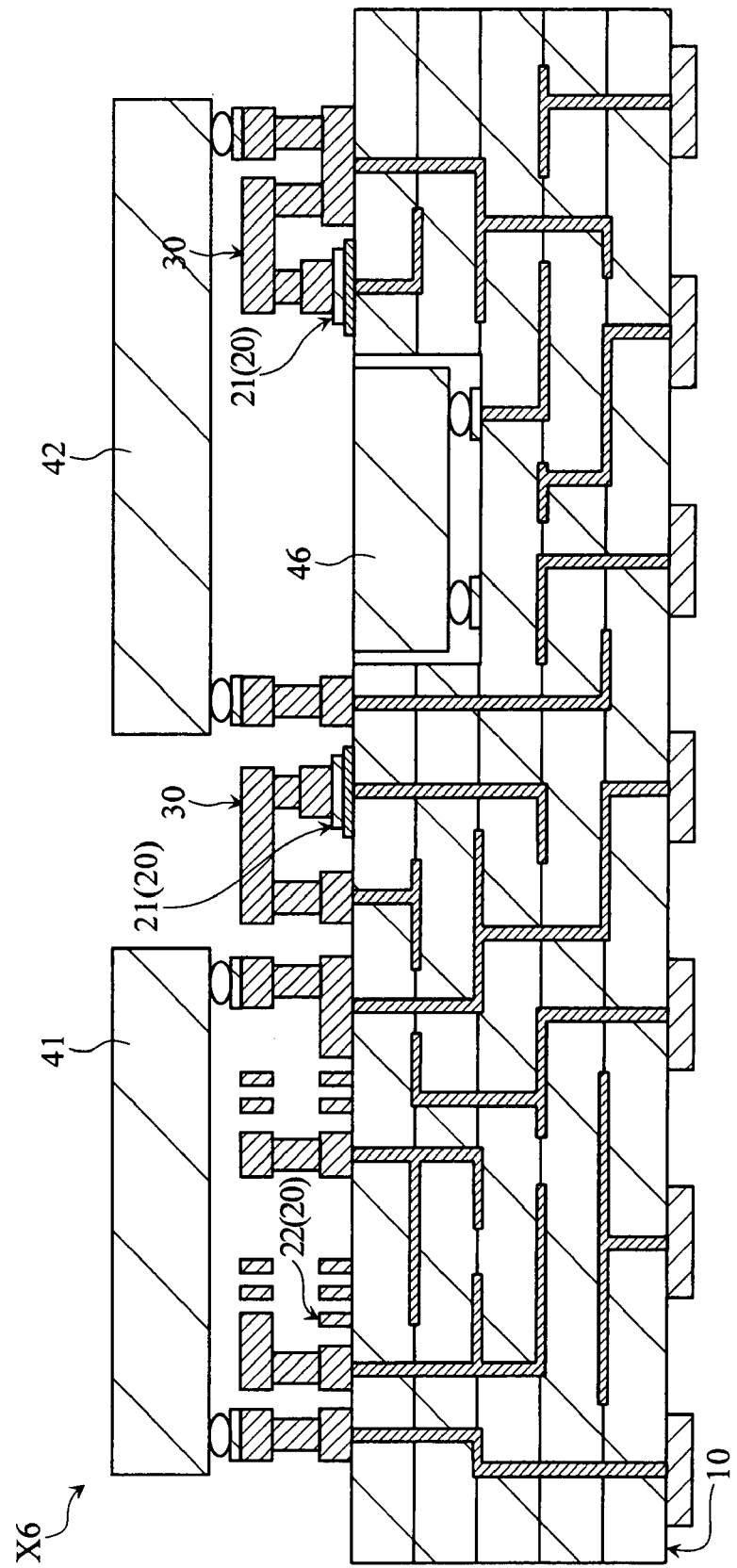
FIG. 16 is a sectional view of an electronic part module according to a sixth embodiment of the present invention.

FIG. 16 is a sectional view of an electronic part module X6 according to a sixth embodiment of the present invention. The electronic part module X6 includes a wiring substrate 10, a passive device group 20, three-dimensional wiring 30, and device chips 41, 42, 46. The electronic part module X6 is substantially the same as the electronic part module X1, differing only in that it further includes the device chip 46 placed in a predetermined recess in the wiring substrate 10.

Figure 17:
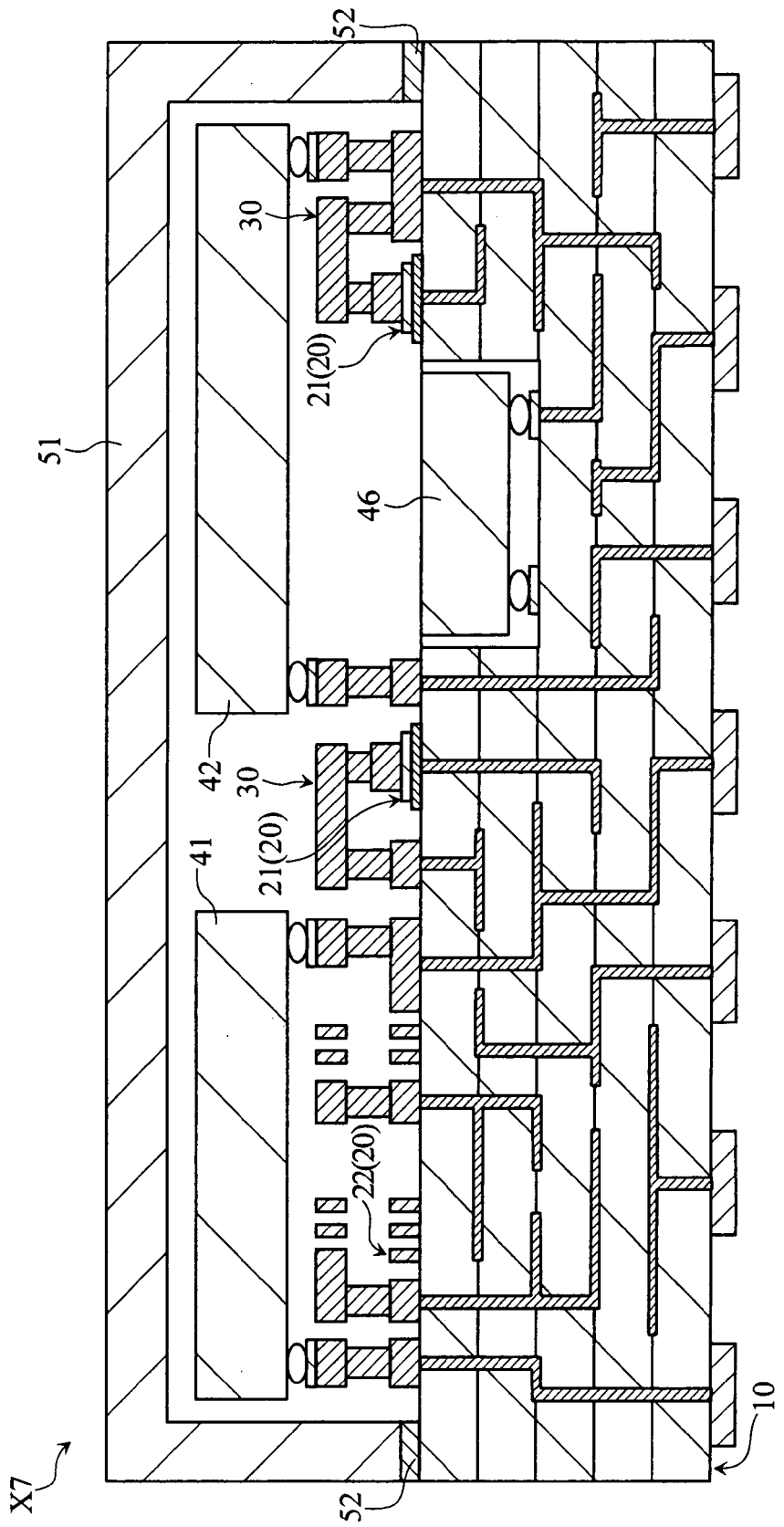
FIG. 17 is a sectional view of an electronic part module according to a seventh embodiment of the present invention.

FIG. 17 is a sectional view of an electronic part module X7 according to a seventh embodiment of the present invention. The electronic part module X7 differs from the electronic part module X6 in that it further includes a sealing cap 51. The sealing cap 51 is the same as the sealing cap 51 according to the electronic part module X2 in its material and the way it is bonded to the wiring substrate 10.

Figure 18:
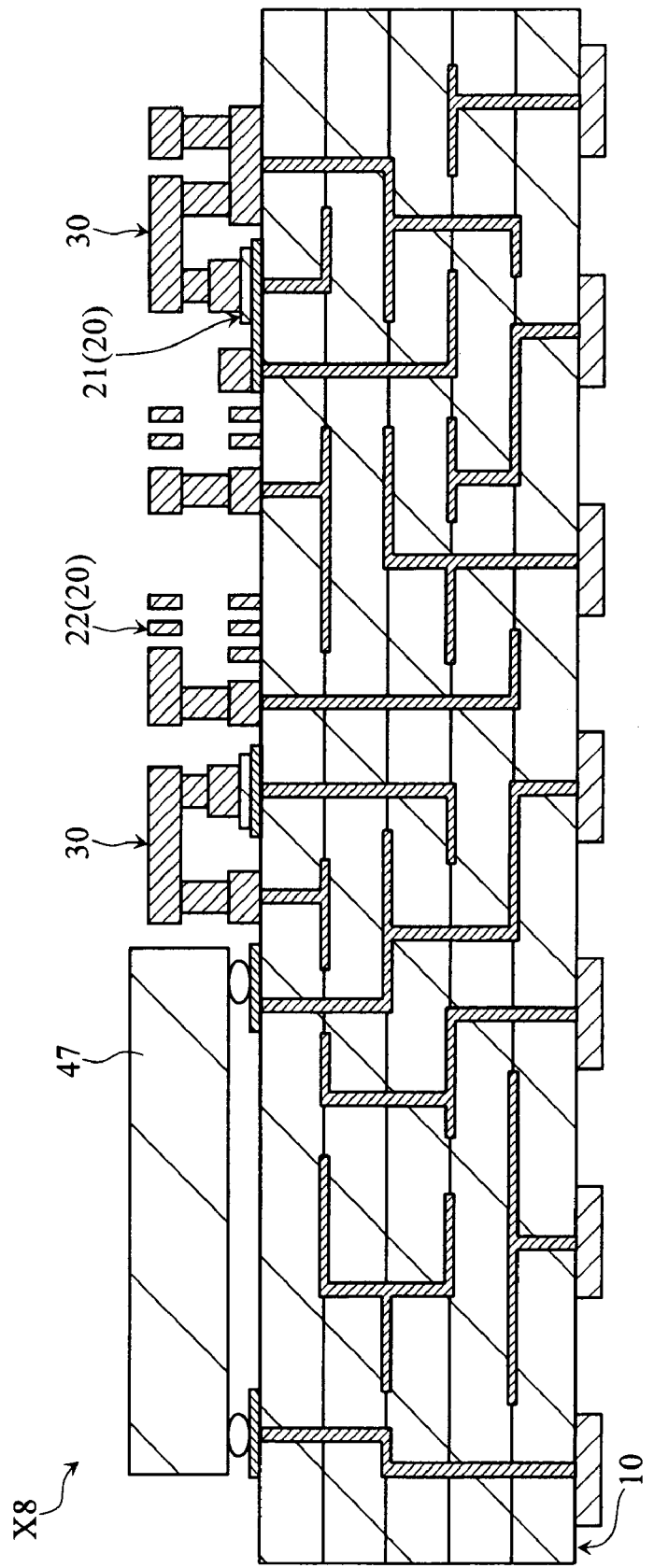
FIG. 18 is a sectional view of an electronic part module according to an eighth embodiment of the present invention.

FIG. 18 is a sectional view of an electronic part module X8 according to an eighth embodiment of the present invention. The electronic part module X8 includes a wiring substrate 10, a passive device group 20, three-dimensional wiring 30, and a device chip 47. The device chip 47 is mounted directly onto the wiring substrate 10 without depending upon the three-dimensional wiring 30. The electronic part module according to the present invention may also have such an arrangement in mounting the device chips.

Figure 19:
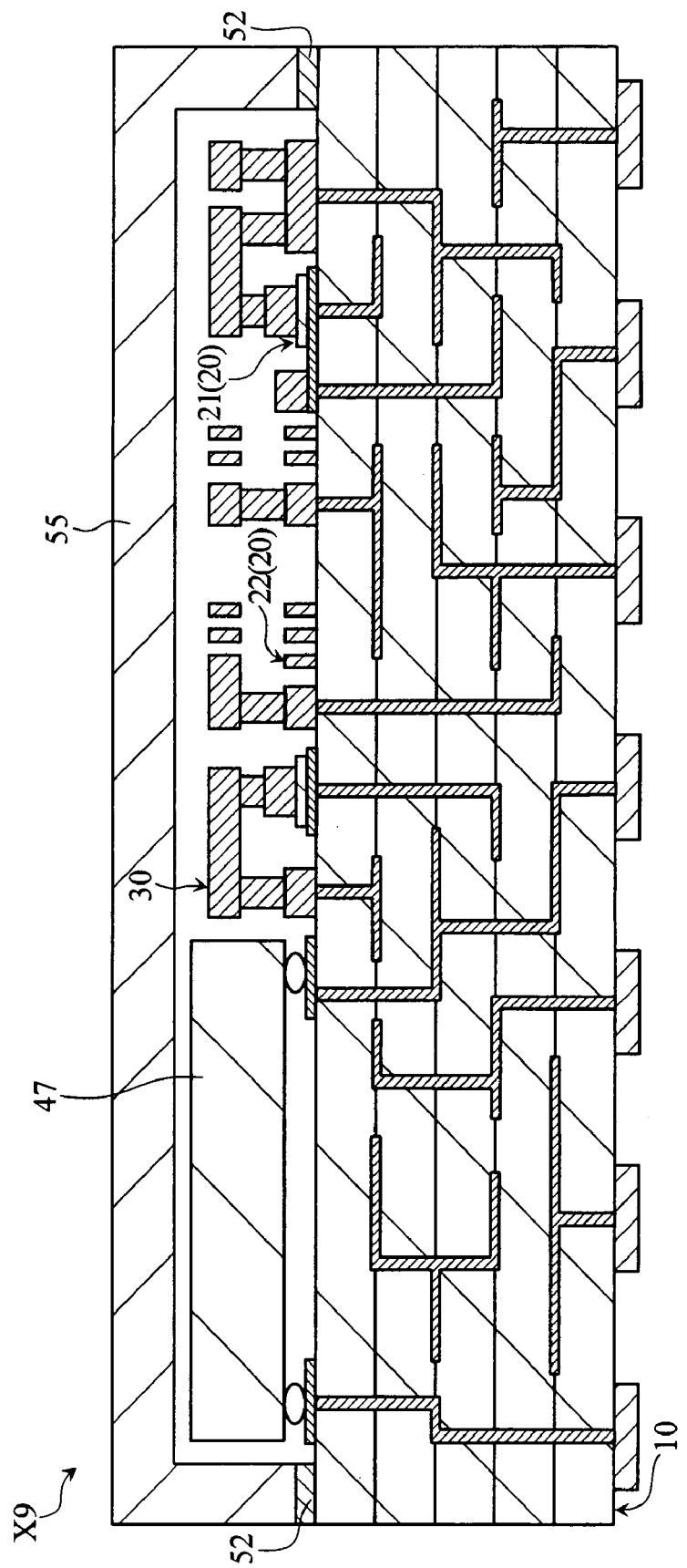
FIG. 19 is a sectional view of an electronic part module according to a ninth embodiment of the present invention.

FIG. 19 is a sectional view of an electronic part module X9 according to a ninth embodiment of the present invention. The electronic part module X9 differs from the electronic part module X8 in that it further includes a sealing cap 55. The sealing cap 55 is the same as the sealing cap 51 according to the electronic part module X2 in its material and the way it is bonded to the wiring substrate 10.

The invention claimed is:

1. An electronic part module comprising:
a wiring substrate having an obverse surface;
a passive device group including a plurality of passive devices formed on the obverse surface of the wiring substrate; and
at least one device chip mounted on the wiring substrate;
wherein the passive devices include a multi-coil inductor, and
wherein the multi-coil inductor includes a first spiral coil, a second spiral coil and a connecting portion that connects the first spiral coil and the second spiral coil to each other, and wherein the first spiral coil and the second spiral coil at least partially overlap with each other as viewed in a direction perpendicular to the obverse surface of the wiring substrate, the first spiral coil and the second spiral coil being spaced from each other in the direction perpendicular to the obverse surface of the wiring substrate, with a gap in between the first spiral coil and the second spiral coil, a top surface, a bottom surface, and a side surface of one of the first spiral coil and the second spiral coil being exposed to air.

2. The electronic part module according to claim 1, wherein the passive devices comprise at least one of a capacitor and a resistor formed on the wiring substrate.

3. The electronic part module according to claim 1, further comprising three-dimensional wiring including a first wiring portion extended on the wiring substrate, a second wiring portion extended along but space from the wiring substrate, and a third wiring portion extended in a thickness direction of the wiring substrate.

4. The electronic part module according to claim 1, wherein the device chip is above the passive device group.

5. The electronic part module according to claim 1, wherein the wiring substrate is formed with a recess, the device chip being in the recess.

6. The electronic part module according to claim 1, wherein the device chip is inside the wiring substrate.

7. The electronic part module according to claim 1, wherein the device chip includes a high-frequency filter.

8. The electronic part module according to claim 1, wherein said at least one device chip comprises a semiconductor device.

9. The electronic part module according to claim 1, wherein the wiring substrate is provided by a multilayer wiring substrate including at least one inner wiring layer.

10. The electronic part module according to claim 1, wherein the wiring substrate comprises a via penetrating the wiring substrate.

11. The electronic part module according to claim 1, further comprising a sealing cap.

12. The electronic part module according to claim 7, wherein the high-frequency filter is constituted by a single or a plurality of filters selected from a group consisting of SAW filter, FBAR filter and micromachine vibration filter.

13. The electronic part module according to claim 8, wherein the semiconductor device comprises an amplifier for amplifying signals.

14. The electronic part module according to claim 9, wherein the multilayer wiring substrate is provided by a multilayer ceramic wiring substrate including a laminated plurality of ceramic layers.

15. The electronic part module according to claim 9, wherein the multilayer wiring substrate comprises a plurality of laminated resin layers.

16. The electronic part module according to claim 9, wherein the wiring substrate comprises a via for making connection with an inner wiring layer.

* * * * *